United States Patent
Schricker et al.

(10) Patent No.: US 10,892,385 B2
(45) Date of Patent: Jan. 12, 2021

(54) LED FABRICATION USING HIGH-REFRACTIVE-INDEX ADHESIVES

(71) Applicant: Lumileds LLC, San Jose, CA (US)

(72) Inventors: April Dawn Schricker, San Jose, CA (US); Daniel Roitman, Menlo Park, CA (US); Nicolaas Joseph Martin Van Leth, Valkenswaard (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/735,176

(22) PCT Filed: Jun. 6, 2016

(86) PCT No.: PCT/US2016/036071
§ 371 (c)(1),
(2) Date: Dec. 9, 2017

(87) PCT Pub. No.: WO2016/200739
PCT Pub. Date: Dec. 15, 2016

(65) Prior Publication Data
US 2018/0159001 A1    Jun. 7, 2018

Related U.S. Application Data

(60) Provisional application No. 62/172,834, filed on Jun. 9, 2015.

(51) Int. Cl.
*H01L 33/56* (2010.01)
*H01L 33/50* (2010.01)
*C08J 3/24* (2006.01)

(52) U.S. Cl.
CPC ............ *H01L 33/56* (2013.01); *C08J 3/242* (2013.01); *H01L 33/50* (2013.01); *H01L 2933/005* (2013.01)

(58) Field of Classification Search
CPC ................. H01L 33/56; C08J 3/242
See application file for complete search history.

(56) References Cited

U.S. PATENT DOCUMENTS

| 7,875,533 B2 | 1/2011 | Epler et al. |
| 2008/0050527 A1* | 2/2008 | Campbell ............ C08G 18/80 427/340 |

(Continued)

FOREIGN PATENT DOCUMENTS

| JP | 2010-107680 | 5/2010 |
| TW | 200901506 A | 1/2009 |

(Continued)

*Primary Examiner* — Jamie C Niesz

(57) ABSTRACT

Silicone-containing adhesive layer formed by cyclic ring-opening polymerization and comprising amounts of an organic base and bonding a wavelength converting layer to a thickness of sapphire in a light-emitting diode (LED) apparatus. Methods enabling its uninhibited curing so as to achieve contaminant-free and debris-free adhesion between surfaces. LED apparatus designed and manufactured such that surfaces to be bonded together are prepared in a manner that facilitates use of high-refractive-index adhesives. A multi-step process involving two different concentrations of a catalyst is performed so as to fabricate highly-reliable, non-browning, and non-cracking high-refractive-index adhesives for light-emitting diode component fabrication.

18 Claims, 20 Drawing Sheets

(56) References Cited

U.S. PATENT DOCUMENTS

| | | | | |
|---|---|---|---|---|
| 2013/0258483 A1* | 10/2013 | Pett | ................. | G02B 1/111 |
| | | | | 359/601 |
| 2014/0111976 A1 | 4/2014 | Ko et al. | | |
| 2014/0306259 A1 | 10/2014 | Liu et al. | | |
| 2014/0309448 A1 | 10/2014 | Liu et al. | | |
| 2014/0309449 A1 | 10/2014 | Liu et al. | | |
| 2014/0309450 A1 | 10/2014 | Liu | | |
| 2015/0069711 A1* | 3/2015 | Johnson | ............ | F16J 15/022 |
| | | | | 277/300 |

FOREIGN PATENT DOCUMENTS

| | | |
|---|---|---|
| WO | 2013/011832 | 1/2013 |
| WO | 2014/173821 | 10/2014 |

\* cited by examiner

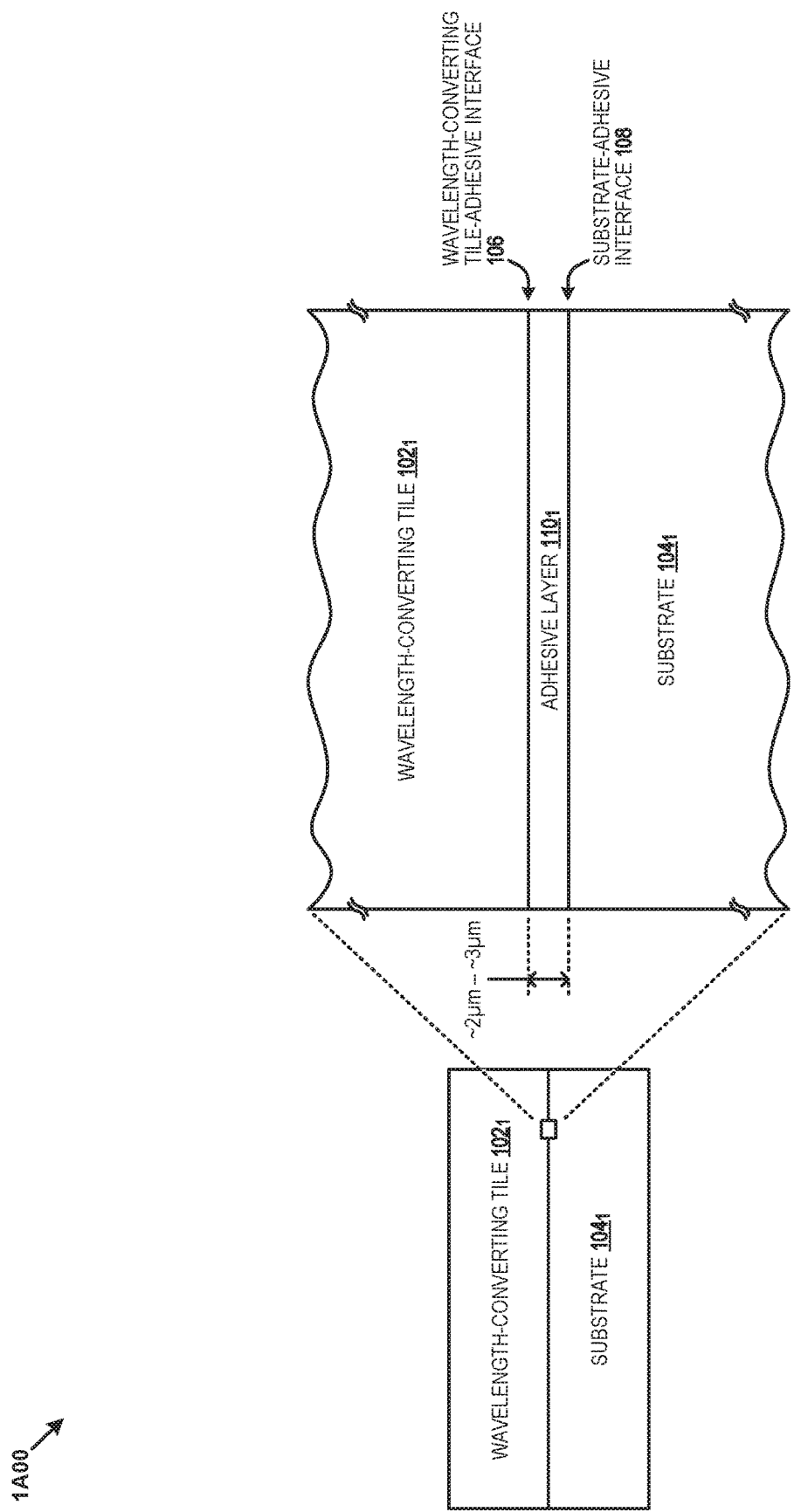
FIG. 1A1

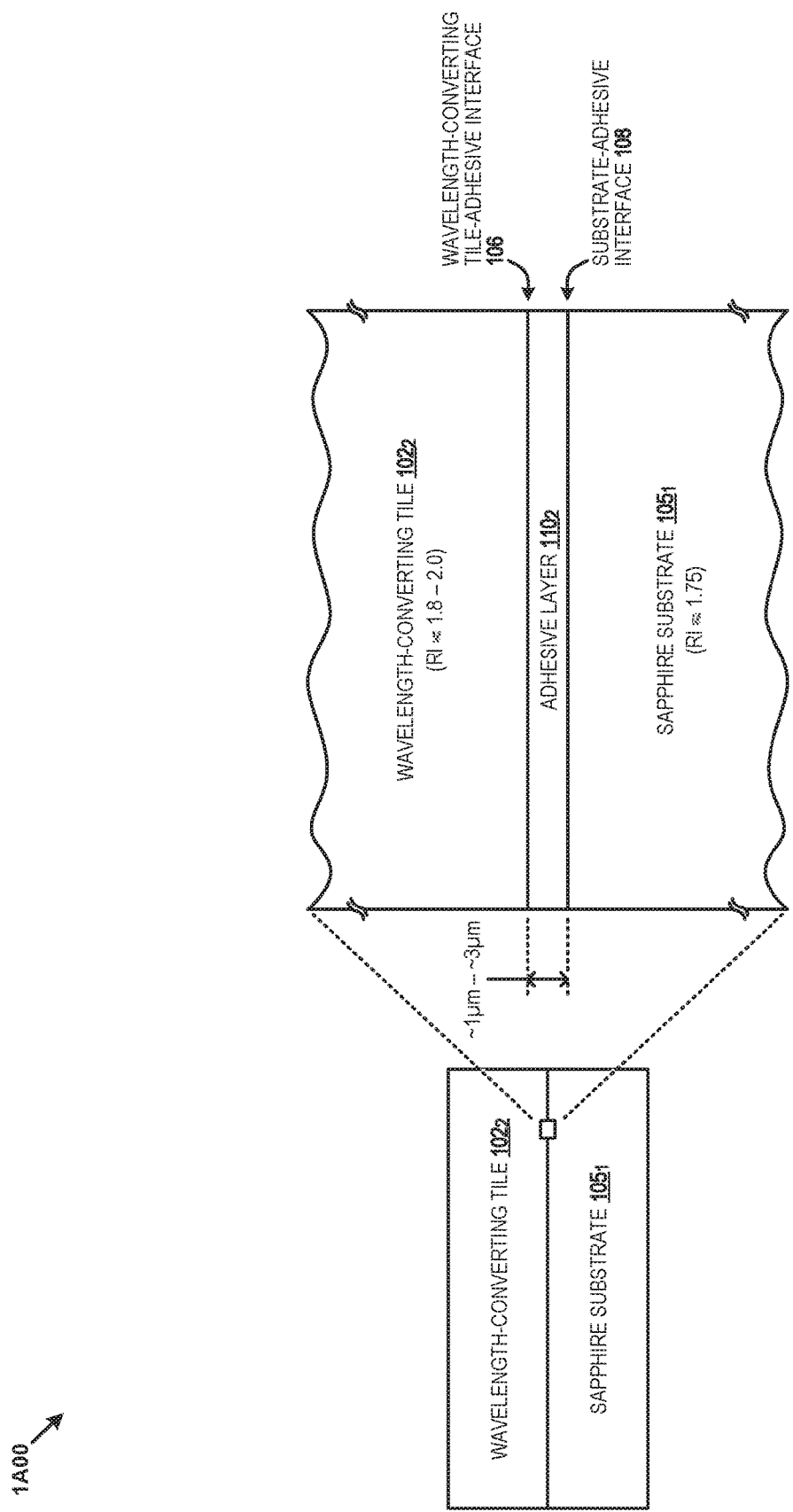
FIG. 1A2

LED FABRICATION USING HIGH-REFRACTIVE-INDEX ADHESIVES

CROSS-REFERENCE TO RELATED APPLICATIONS

This application is the U.S. National Stage, under 35 U.S.C. § 371, of International Application No. PCT/US2016/036071, filed Jun. 6, 2016, which claims the benefit of U.S. Provisional Application No. 62/172,834, filed Jun. 9, 2015, the contents of which are hereby incorporated by reference herein.

FIELD OF INVENTION

This disclosure relates to light-emitting diode component fabrication, and more particularly to techniques for light-emitting diode component fabrication using high-refractive-index adhesives.

BACKGROUND

The extraction efficiency of light-emitting diodes (LEDs) is often measured in terms of the amount of light (e.g., lumens) that actually escapes the light-generating active regions and surrounding structures of the LED. In some cases the surrounding structures include wavelength-converting materials (e.g., phosphor-containing wavelength-converting tiles) that are bonded to, or otherwise in close proximity to, the active region of the LED. The transmission of a photon through one material, through an interface, to another material can be relatively more efficient (e.g., when the angle of incidence at the interface is small) or can be relatively more inefficient (e.g., when the angle of incidence at the interface is larger). In many cases, an LED component includes several structures that are disposed together, thus forming interfaces that cause a loss of lumens when photons fail to escape the structures. Photons that are not extracted from the LED may generate heat which may reduce the efficiency of the LED.

SUMMARY

According to certain embodiments of the herein-disclosed techniques, surfaces to be bonded together are prepared in a manner that facilitates the use of high-refractive-index adhesives. The present disclosure provides a detailed description of techniques used in light-emitting diode component fabrication using high-refractive-index adhesives. More particularly, the herein-disclosed techniques address aspects of selection of a high-refractive-index adhesive as well as handling techniques so as to deposit and cure silicone adhesives between surfaces while an LED component is undergoing fabrication.

Certain embodiments are directed to technological solutions such that surfaces to be bonded together are prepared in a manner that facilitates the use of high-refractive-index adhesives, which embodiments advance the relevant technical fields as well as advancing peripheral technical fields. The herein-disclosed techniques provide technical solutions that address the technical problems attendant to effective use of high-refractive-index (RI) adhesives to achieve a high RI and uniform media interfaces between surfaces.

Further details of aspects, objectives, and advantages of the technological embodiments are described herein and in the following descriptions, drawings, and claims.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

FIG. 1A1 and FIG. 1A2 present cross-section side views and insets of a two-surface bonding technique as used during light-emitting diode component fabrication when using high-refractive-index adhesives, according to an embodiment.

FIG. 2 depicts a series of processes as used in fabrication of high-reliability light-emitting diode components using wavelength-converting tiles, according to an embodiment.

DETAILED DESCRIPTION

Figure 1B:
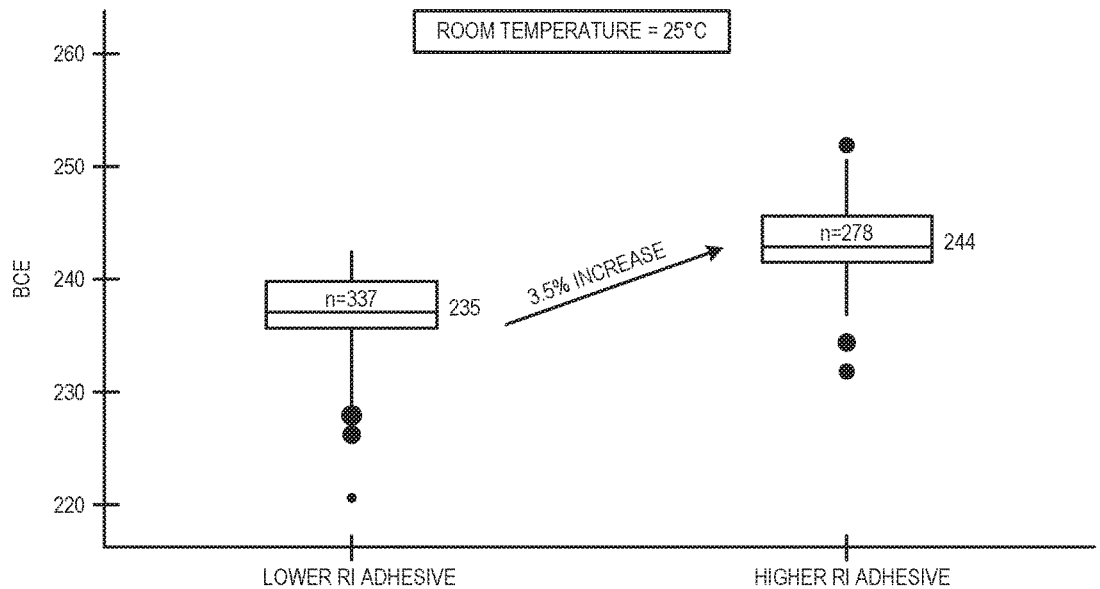
FIG. 1B and FIG. 1C present box plots showing light extraction efficiency improvements achieved when light-emitting diode components are formed using high-refractive-index adhesives, according to an embodiment.

Legacy techniques involve adhesives with a relatively low index of refraction. Total internal reflection at interfaces between the high index semiconductor structure and the low index adhesive may reduce the extraction efficiency of the LED. Certain adhesives with a high index of refraction have been considered, however the effective use (e.g., uninhibited curing) of such adhesives is very sensitive to characteristics (e.g., "cleanliness") of the surfaces to be bonded together.

The surfaces to be bonded together during the course of fabrication of certain LED components are often relatively unclean, and often carry debris (e.g., organic debris, manufacturing process residue, etc.) that inhibit curing of the aforementioned high index adhesives. Moreover, certain earlier-proposed methods of handling high index adhesives fail to consider the effects that such methods have on the reliability of the resulting LED components. Also, certain earlier-proposed methods fail to address manufacturing considerations such as temperature, adhesive cure time, shelf life, etc.

Some embodiments of the present disclosure address the problem of effective use of high-refractive-index adhesives that depend on uninhibited curing so as to achieve adhesion between surfaces. More specifically, some embodiments are directed to approaches for which the surfaces to be bonded together are prepared in a manner that facilitates the use of high-refractive-index adhesives. The accompanying figures and discussions herein present example environments, systems, and methods for making and using light-emitting diode component fabrication using high-refractive-index adhesives.

Overview

Disclosed hereunder are materials and processes used to achieve higher LED performance and reliability through the use of a high-refractive-index siloxane-based adhesive layer that is disposed between two high-refractive-index substrates. Embodiments shown and discussed hereunder include application of techniques for forming an adhesive attachment layer between a wavelength-converting tile (e.g., a phosphor-containing platelet) and an LED substrate material (e.g., sapphire). The disclosed techniques address reliability considerations such as lifetime expectancy under high-temperature operation as is found in, for instance, certain automotive LED applications.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment. An aspect or an advantage described in conjunction with a particular embodiment is not necessarily limited to that embodiment and can be practiced in any other embodiments even if not so illustrated. Also, references throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments.

Definitions

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

DESCRIPTIONS OF EXAMPLE EMBODIMENTS

FIG. 1A1 presents a cross-section side view and inset of a two-surface bonding technique 1A00 as used during light-emitting diode component fabrication when using high-refractive-index adhesives. As an option, one or more variations of two-surface bonding technique 1A00 or any aspect thereof may be implemented in any environment and/or in any context of the embodiments described herein.

As shown, a wavelength-converting tile $102_1$ is bonded to a substrate $104_1$. The inset depicts a detail illustration of a small area between a wavelength-converting tile $102_1$ and a substrate $104_1$. The inset also shows an adhesive layer $110_1$ between the wavelength-converting tile $102_1$ and the substrate $104_1$. In this embodiment, the adhesive layer $110_1$ is about 2 microns to about 3 microns in thickness (as shown). Photons emanate from an active layer below the substrate and propagate through the substrate to the interface between the substrate and the adhesive layer (e.g., the shown substrate-adhesion interface 108) at which interface the photon may be refracted a first time. The photon propagates through the adhesive layer to the interface between the adhesive layer and the wavelength-converting tile (e.g., the shown wavelength-converting tile-adhesion interface 106) at which interface the photon may be refracted a second time. To increase extraction efficiency by reducing the number of photons lost to misdirection of photons (e.g., due to total internal reflection), the index of refraction of the various materials should be matched. The following FIG. 1A2 depicts materials with their respective index of refraction indicated.

Figure 2:
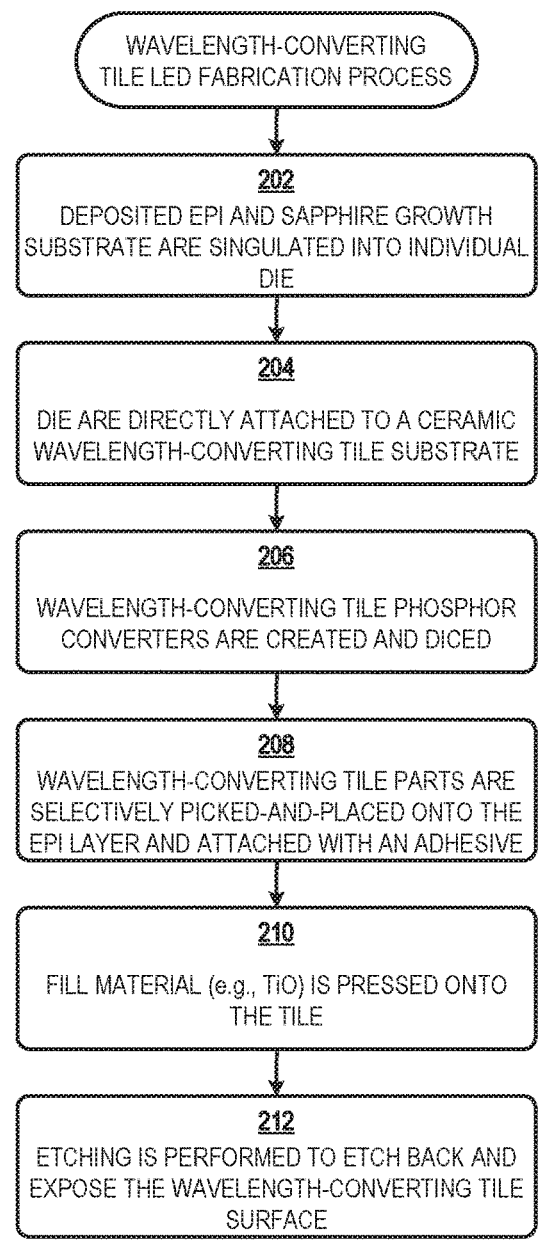

FIG. 1A2 presents a cross-section side view and inset of a two-surface bonding technique 1A00 as used during light-emitting diode component fabrication when using high-refractive-index adhesives.

As shown, a wavelength-converting tile $102_2$ (e.g., a Lumiramic tile) is bonded to a sapphire substrate $105_1$. The inset depicts a detail illustration of a small area between a wavelength-converting tile $102_2$ and a sapphire substrate $105_1$. The inset also shows an adhesive layer $110_2$ between the wavelength-converting tile $102_2$ and the sapphire substrate $105_1$. In this embodiment, the adhesive layer $110_2$ is about 1 micron to about 3 microns in thickness (as shown). Photons emanate from an active layer below the sapphire substrate and propagate through the sapphire substrate to the interface between the sapphire substrate and the adhesive layer (e.g., the shown substrate-adhesion interface 108), at which interface the photon is refracted a first time. The photon propagates through the adhesive layer to the interface between the adhesive layer and the wavelength-converting tile (e.g., the shown wavelength-converting tile-adhesion interface 106), at which interface the photon is refracted a second time. To increase extraction efficiency by reducing the number of photons lost to misdirection of photons (e.g., due to total internal reflection), the index of refraction of the various materials should be matched.

In some embodiments, the adhesive layer is a thin silicone-based adhesive or glue layer (SGL) that serves to bond the substrate having an index of refraction (RI) of about 1.75 to the wavelength-converting tile having an index of refraction of about 1.8 to about 2.

This "sandwich" can be used in many packages and applications. Strictly as examples, such a sandwich can be used in flip chip bonding using thin film device technology.

Further details regarding a general approach to flip chip bonding using thin film device technology are described in U.S. Pat. No. 7,875,533, which is hereby incorporated by reference in its entirety.

Application of the techniques pertaining to packaging of integrated thin film LED devices (e.g., as described in U.S. Pat. No. 7,875,533) has led to significant increases in light output. In some embodiments, a sapphire substrate is used, and the sapphire is left attached to the epitaxially-deposited layers (EPI) to improve the stability of the device under extreme current and temperature conditions. One particular class of LEDs (e.g., wavelength-converted InGaN devices) can be fabricated using the process described in FIG. 2 infra.

In the inexorable quest for more lumens, it was discovered that use of adhesives having a higher refractive index can increase light extraction (CE) by several percent.

Figure 1C:
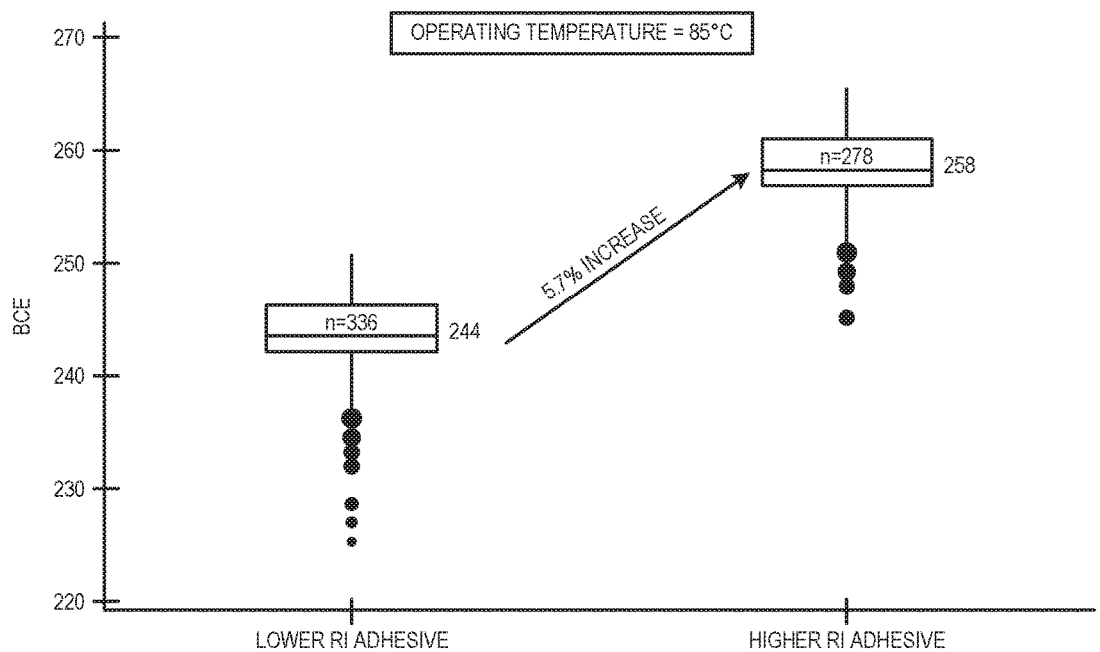

FIG. 1B and FIG. 1C present box plots showing light extraction efficiency improvements achieved when light-emitting diode components are formed using high-refractive-index adhesives. FIG. 1B shows that an increase of the refractive index from ca. RI=1.4 (e.g., using an SGL known as "KJR-9226D") to ca. RI=1.5 (e.g., using an SGL known as "SGLX-35") to attach the wavelength-converting tile to the substrate the CE, the gain can be increased by roughly 4%.

Further, in comparing a representative lower RI adhesive to a higher RI adhesive, empirical data taken at both room temperatures (e.g., about 25° C.) as well as at operating temperatures (e.g., about 85° C.) shows that the CE can be still further increased at higher temperatures.

Having made this discovery, designs of light-emitting diode components can now include selection of higher RI adhesives. However, inasmuch as there are trade-offs between the use of various SGLs involving their cure methods and reliability, selection of an SGL may avail of a selection chart, such as is presented in the following FIG. 1D.

Figure 1D:
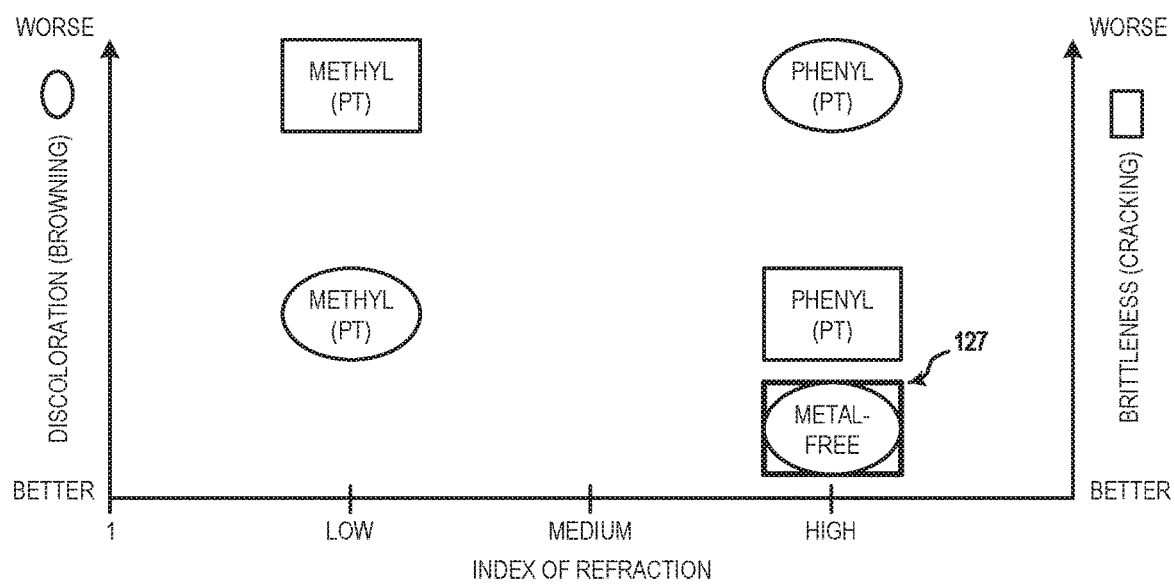
FIG. 1D depicts several silicone types plotted on a silicone selection chart used when designing high-reliability light-emitting diode components using adhesives, according to an embodiment.

FIG. 1D depicts several silicone types plotted on a silicone selection chart 1D00 that is used when designing high-reliability light-emitting diode components using adhesives. Many adhesives made of clear polymer materials can be cured using different crosslinking or curing methods. Many siloxanes used in LEDs are crosslinked by reactions catalyzed by Pt and other metals. Other siloxanes cure using cyclic ring-opening polymerization methods (e.g., catalyzed with an acid or base), and some materials (e.g., certain siloxanes) cure using condensation polymerization methods, and can also be catalyzed by an acid or base. Acid and base catalysis is referred to as "metal-free" systems, as compared to the aforementioned Pt-catalyzed addition polymerization. Materials that cure using these different catalysts are depicted as occupying respective sets of ranges of their index of refraction (see the abscissa of selection chart) for the corresponding ranges against a lifetime reliability metric (see the ordinate of selection chart).

Strictly as an example, the plot depicts polydimethylsiloxane-containing materials. Polydimethylsiloxane-containing materials are among the most photothermally stable and optically clear polymer materials known. Unfortunately polydimethylsiloxane (PDMS) exhibits a relatively low refractive index (ca. 1.4) as well as photo and thermal degradation processes that result in relatively poor fracture toughness. Silicones that exhibit a higher RI (e.g., ca.>1.5) are desired in many applications.

Commercially available high-refractive-index (e.g., HRI, ca. RI>1.5) glue siloxanes contain some fraction of phenyl-methyl and/or phenyl-phenyl side chain substituents. Additionally, most commercially available high refraction index silicones use platinum to catalyze the silicone polymerization and to initiate the crosslinking reaction. Under high operational temperatures and high light flux these moieties (e.g., silicone and Pt) are known to initiate discoloration (browning) at significantly faster rates than PDMS-based resins.

Further details regarding making and using such uses of HRI silicones are described in U.S. Patent Publication Nos. 2014/0309450, 2014/0309449 and 2014/0309448, which are hereby incorporated by reference in their entirety.

The selection chart indicates that, although there are various choices of silicones over a range of index of refraction, the trend shows that as the index of refraction increases and the expected rate of discoloration (browning) increases for metal-catalyzed resins. There are nevertheless a group of silicones (e.g., see metal-free silicones 127) that have high RIs while exhibiting stable hardness over aging and further exhibiting resistance to browning. One such metal-free silicone is known as "HT8600". The aforementioned HT8600 is merely one example of a high RI siloxane that is metal-free and does not brown as much as comparable high RI siloxanes that are metal-catalyzed.

Metal-free siloxanes such as the aforementioned HT8600 may be based on a cyclic ring-opening polymerization technology (e.g., that can lead to a ladder-like molecular architecture) or may include other metal-free siloxanes that involve condensation polymerization. While the aforementioned metal-free polymerization systems exhibit less browning than Pt-catalyzed resins of a comparable refractive index, the condensation polymerization process has side effects that make handling more difficult and/or impractical. Strictly as one example of such side effects, condensation polymerization often results in residual "leaving groups" (such as water, alcohols, organic acids) that introduce additional usage complications. Further, the needed resin precursors might be sensitive to humidity or other environmental factors that introduce still further usage complications. The aforementioned ring-opening polymerization techniques do not produce "leaving groups", thus offering improved ease-of-use conditions over condensation polymerization in addition to producing adhesives that exhibit desirable characteristics of low shrinkage, moldability, and low gaseous emissions.

Neither the ring-opening catalysis mechanisms nor the condensation catalysis mechanisms require platinum or other metals. Both methods can be activated by acids and bases. However acid or base catalysis have the following process characteristics:

When the catalysts remain trapped in the resin after cure, it can lead to browning.

In large surface-to-volume applications such as when using powder slurries and/or in thin bond-line adhesive applications, the reactions become inhibited by the mechanism of adsorption of the catalysts onto the surfaces, or by the mechanism of acid-base neutralization, or by both mechanisms.

Trapped Catalysts

Platinum-based and other metal-based catalysts cannot be easily removed from the silicones. Often the presence of residual catalysts tend to accelerate browning in high RI silicones, as well as embrittlement of low RI silicones. Moreover, the acids and bases used in the catalytic processes are often relatively volatile and/or often breakdown into volatile species during or after cure. Such residual catalysts are referred to as "fugitive catalysts". Examples of the fugitive catalysts are tetrabutylphosphonium hydroxide (TBPOH) and tetramethylammonium hydroxide (TMAOH). Some organic bases that serve as catalysts can sometimes be removed by evaporation (e.g., during or after cure). Examples include tetramethylguanidine (TMG), and amidine bases 1,5-Diazabicyclo[4.3.0]non-5-ene (DBN), 1,8-diazabicyclo[5.4.0]undec-7-ene (DBU), and 1,5,7-triazabicyclo[4.4.0]dec-5-ene (TBD). Variations or formulations of the foregoing organic bases might comprise guanidines and/or amidines and/or phophazenes and/or quaternary phosphonium and/or ammonium hydroxides, or any combinations thereof.

In some cases the boiling point or decomposition temperatures are relatively high (e.g., ca>100° C.), leading to further ease-of-use complications since it is generally desired to use organic catalysts in low concentrations so as not to result in extended crosslinking at room temperature while still having a boiling point low enough that the residual catalysts can be removed or decomposed at sufficiently higher temperatures (e.g., >130° C.). In some cases, acid-base catalysts generate gaseous HCl or acetic acid, both of which are considered corrosive to LED components.

Large Surface-to-Volume Applications

As used herein, a large surface to volume ratio refers to a ratio>0.1 $m^2$/cc. Strictly as one example, in situations having a large surface to volume ratio, the herein-described bonding application has a sought-after thin bond-line of about 1 μm to about 10 μm. The areas in contact with the adhesive are in the range of about 2 $mm^2$ to about 10 $mm^2$. Further, the surface area of the substrate and tile are about 2 $mm^2$ to about 20 $mm^2$, whereas the weights are in the range from about 1 mcg to about 10 mcg, resulting in a spread of about 0.2 $m^2$ to 20 $m^2$ per gram of resin.

In addition to inhibition by the heretofore-described adsorption neutralization or sequestration by the intrinsic characteristics of the phosphors, some environments introduce the possibility of extrinsic inhibition by contaminants (e.g., acids that are used in soldering fluxes, and/or organic residues from the transfer tapes involved in the manufacturing processes). Discussion of such extrinsic contamination and techniques to process surfaces so as to achieve contaminant-free surfaces are presented infra (e.g., see FIG. 3A).

A technique to circumvent or otherwise manage the adsorption of catalysts (or depletion, or neutralization) and extrinsic contaminants could be offset by increasing catalyst concentration in the formulation. For example, if the prescribed ratio of part A to part B (part B being the catalyst part) for a silicone is 20:1, the proportion of the catalyst in the ratio could be increased so as to achieve a ratio of 15:1 or 10:1. Unfortunately the pot life becomes too short at such high concentrations in the two-part formulation.

Figure 3A:
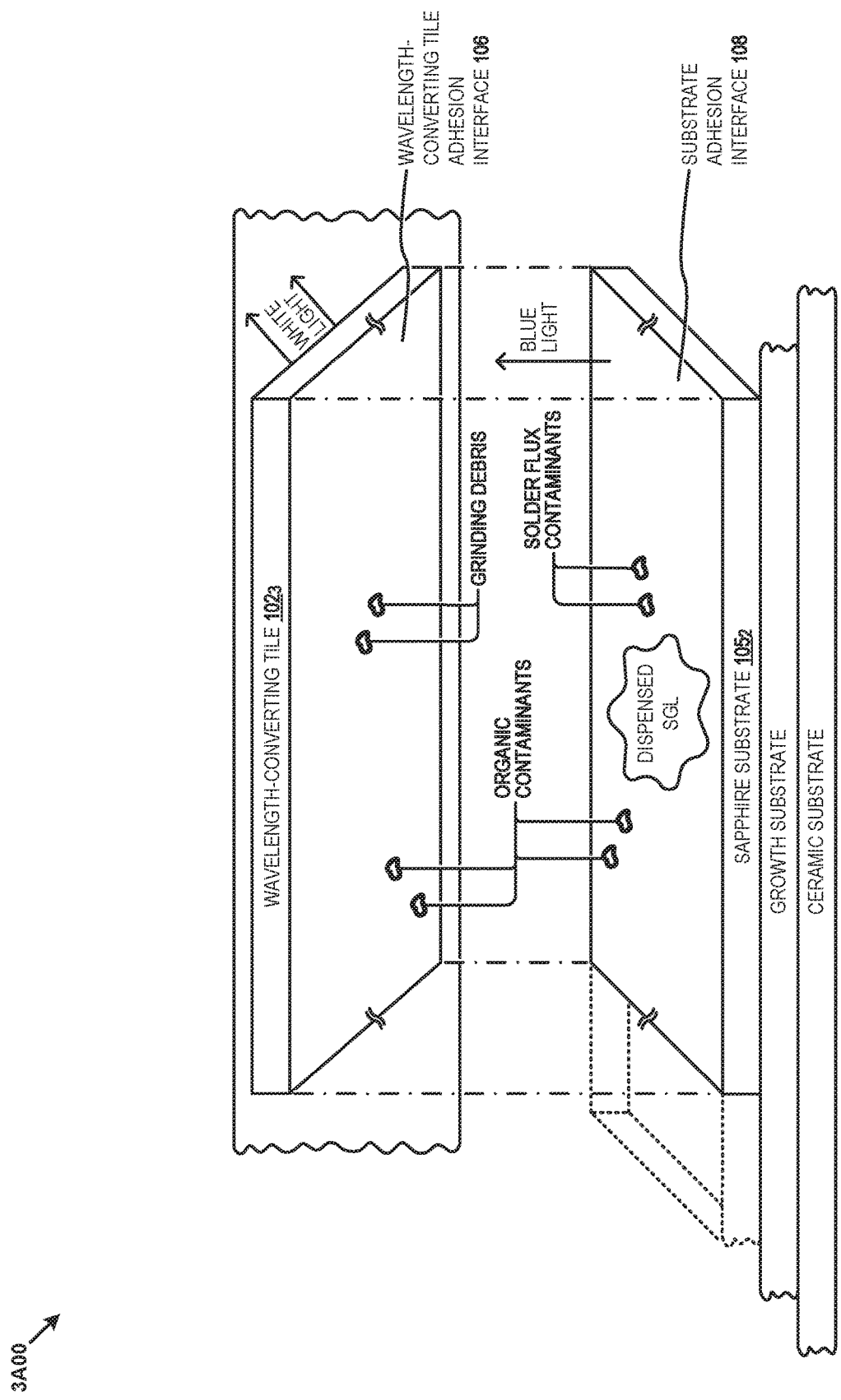
FIG. 3A depicts a debris and contaminant field that inhibits adhesive curing when the adhesive is disposed between surfaces to be bonded together.
Figure 3B:
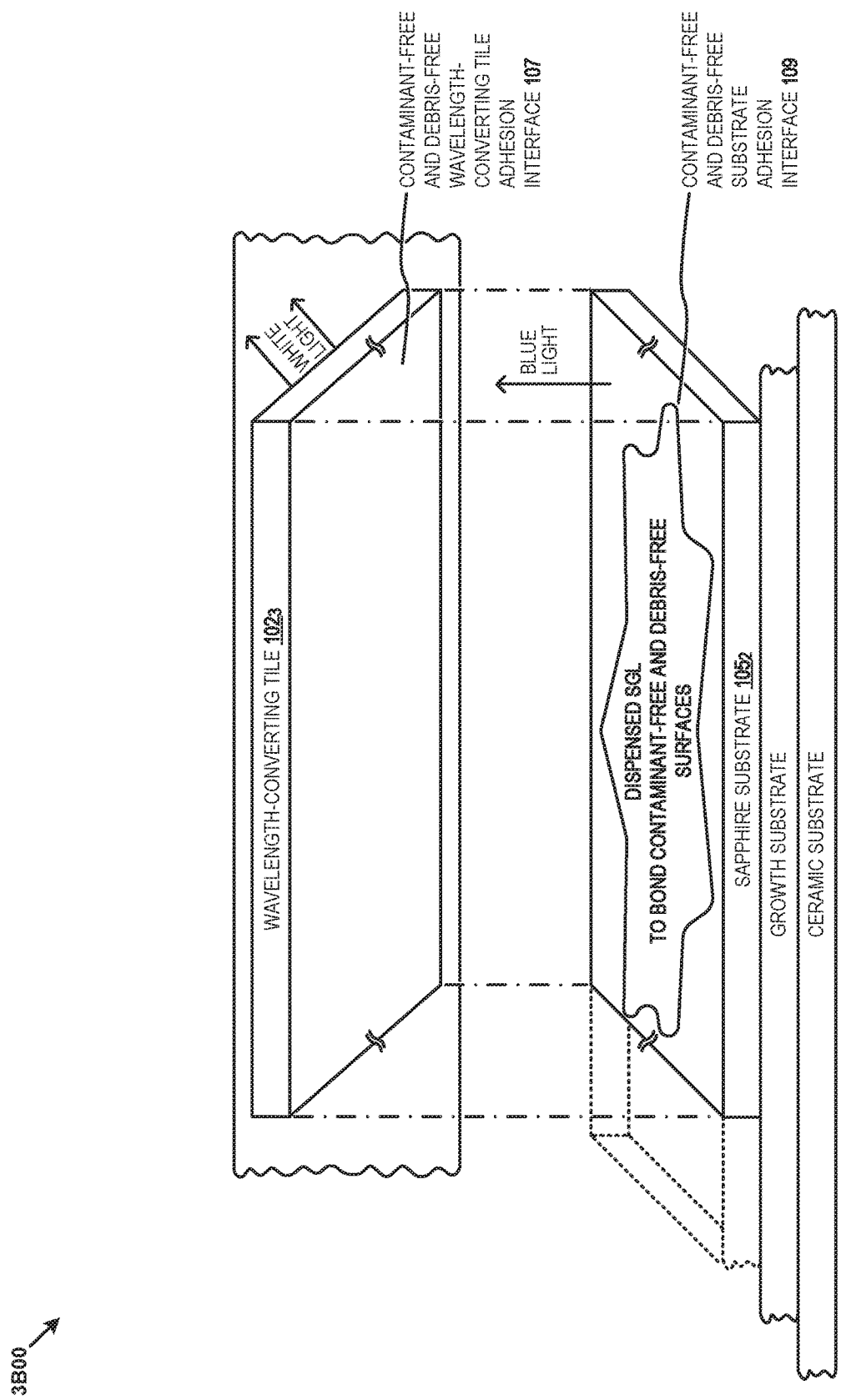
FIG. 3B depicts an assembly technique as used in formation of uniform, high index of refraction media interfaces by using high-refractive-index adhesives, according to an embodiment.
Figure 3C:
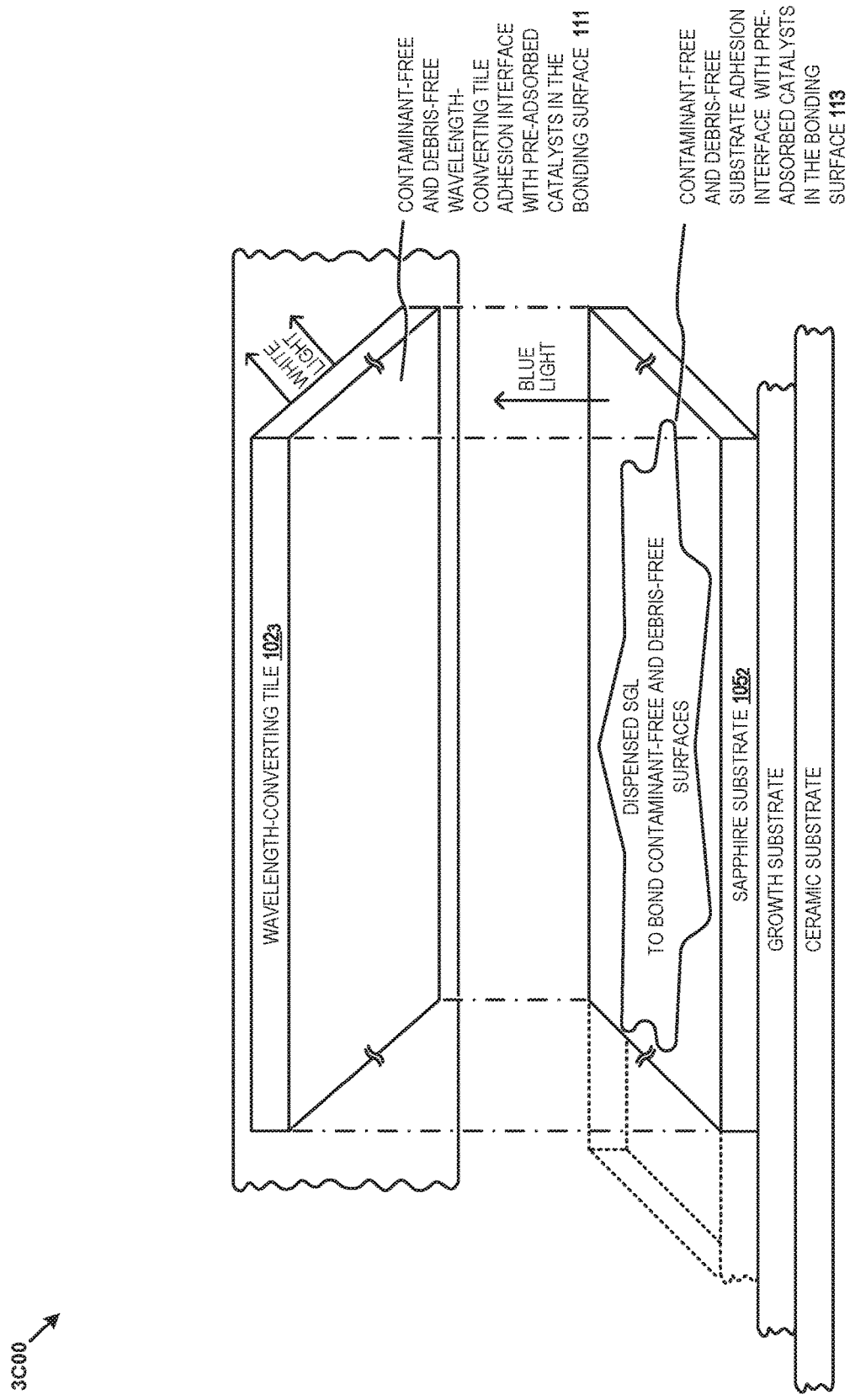
FIG. 3C depicts an assembly technique as used in formation of uniform, high index of refraction media interfaces by using pre-adsorption, according to an embodiment.
Figure 3D:
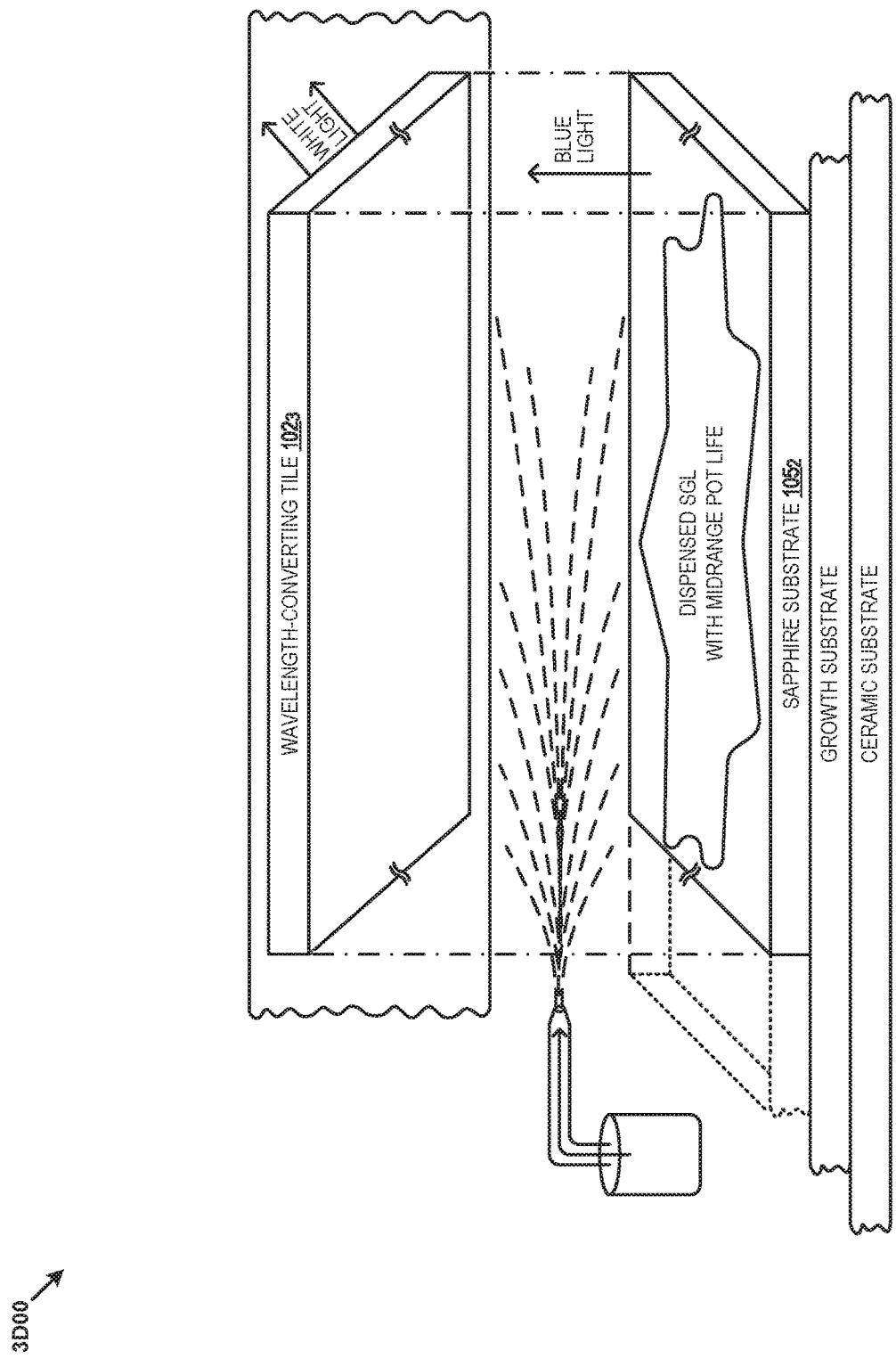
FIG. 3D depicts an assembly technique as used in formation of uniform, high index of refraction media interfaces by using gaseous catalyst introduction, according to an embodiment.

Discussion of a gas introduction technique to circumvent or otherwise manage the adsorption of catalysts while still achieving a desired pot life is presented infra (e.g., see FIG. 3D).

Managing Contamination Sensitivities

Many HRI metal-free silicones are very sensitive to contamination at or from the interfacing surfaces. In some cases the HRI silicones will not cure when the HRI silicone is in contact with contaminated surfaces. Various cleaning and chemical treatment methods described infra facilitate use of HRI silicones in LED component fabrication. The light extraction advantages of the high-refractive-index as well as the non-browning properties of such cyclic ring-opening polymerization-cured silicones (even when operated at high operational temperatures) is strongly desired.

Figure 4A:
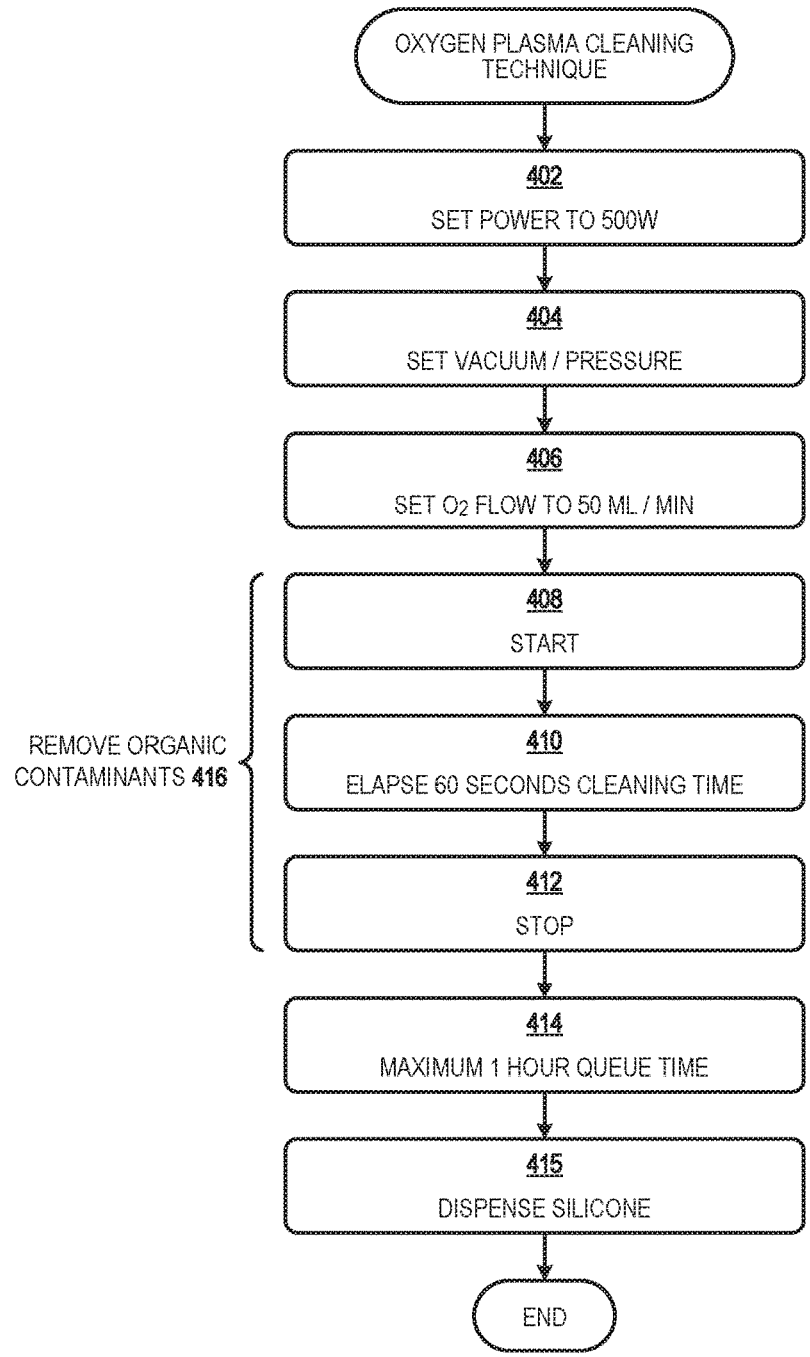
FIG. 4A depicts an oxygen plasma cleaning technique as used in formation of uniform, high index of refraction media interfaces when using high-refractive-index adhesives, according to some embodiments.

Techniques for decontamination of the surfaces (e.g., the bottom surface of the wavelength-converting tiles and the top surface of substrates) that are to be bonded together are discussed as pertaining to FIG. 4A.

Figure 1E:
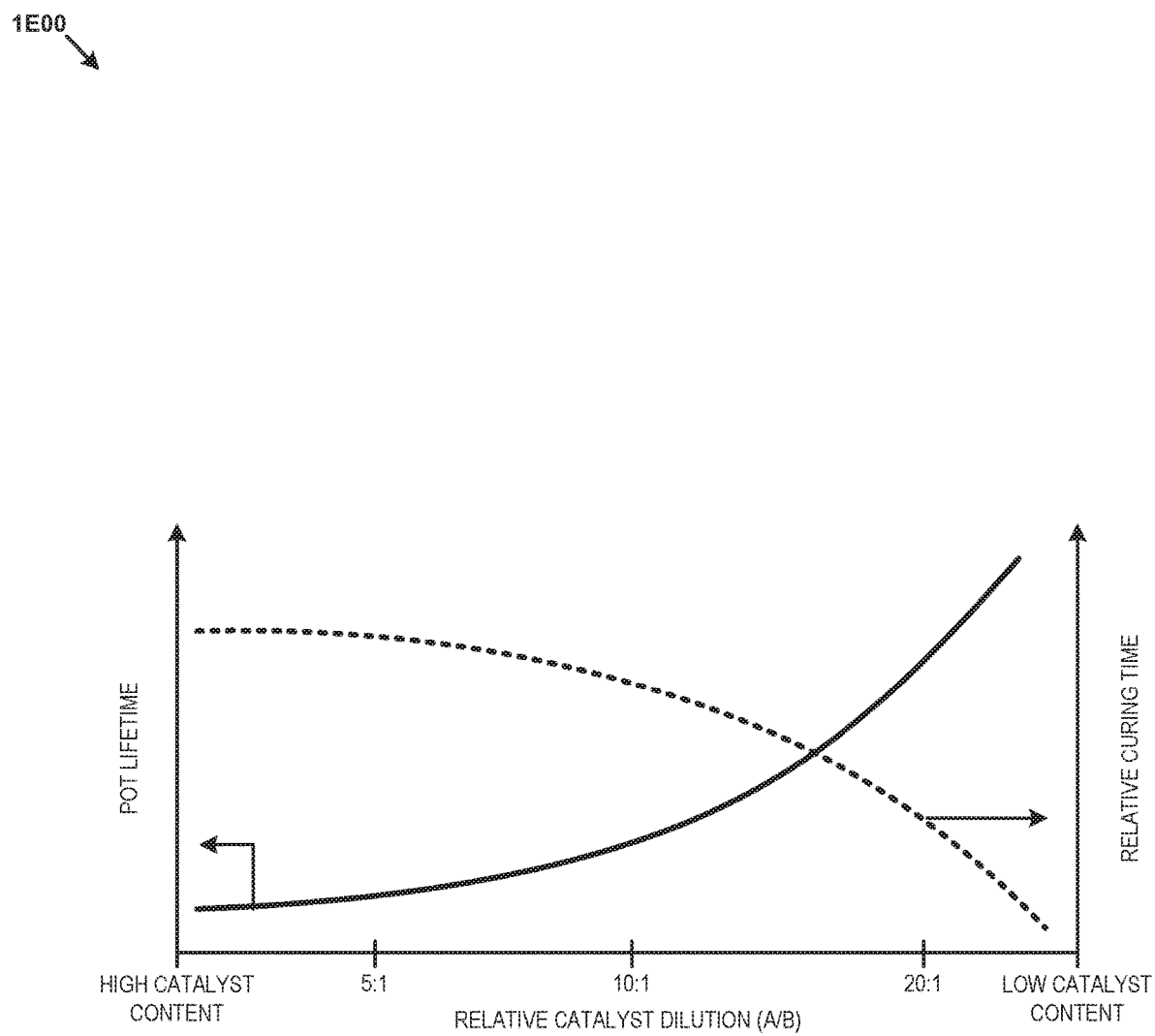
FIG. 1E depicts a plot of pot life plotted as a function of a catalyst ratio used when designing high-reliability light-emitting diode components using adhesives, according to an embodiment.

FIG. 1E depicts a plot 1E00 of pot life plotted as a function of a catalyst ratio. Specifically, the plot depicts a trade-off between pot lifetime and catalyst concentration. In some situations, the need for a relatively long pot life can limit the amount of catalyst that can be incorporated into the resin while still achieving good curing within a reasonable window of time and temperature. Strictly as one example, the shelf life of the aforementioned HT8600 at a 20:1 formulation is nominally 10 hours, which is a relatively short shelf life. Formulations with less catalyst (e.g., with a ratio 25:1) could result in longer pot life but the resin might not cure within a reasonable window of time and temperature. One possible fabrication process that enables long pot life with a satisfactory curing time and temperature window consists on the addition of catalyst at an intermediate step of the process by gaseous or vaporous introduction as shown and described as pertains to FIG. 3D.

FIG. 2 depicts a series of processes 200 as used in fabrication of high-reliability light-emitting diode components using wavelength-converting tiles. As an option, one or more variations of processes 200 or any aspect thereof may be implemented in any environment and/or in any context of the embodiments described herein.

The embodiment shown in FIG. 2 is merely one example of such processes. As shown:

An epitaxially-deposited layer is formed on a growth substrate. The deposited EPI and sapphire growth substrate are singulated into individual die (see step 202);

The die are directly attached to a ceramic wavelength-converting tile substrate (see step 204);

Wavelength-converting tile phosphor converters are created and diced (see step 206);

The wavelength-converting tile parts are selectively picked-and-placed onto the EPI layer and attached with an adhesive (see step 208);

Fill material (e.g., TiO) is pressed onto the wavelength-converting tile (see step 210), Etching is performed to etch back and expose the wavelength-converting tile surface (see step 212).

LED components such as are formed using the foregoing series of processes 200 are suited for many applications, for example, such LED components can be used for automotive headlights.

In a volume manufacturing process, wavelength-converting tile platelets are attached onto the substrate (e.g., a sapphire substrate). The wavelength-converting tile platelets serve to convert the blue light to white light. To attach the wavelength-converting tile platelets to the substrate, an SGL is dispensed onto the sapphire before the wavelength-converting tile is placed onto the dispensed SGL. In some embodiments, a composite such as a titanium oxide silicone composite (TiO-silicone) is molded and pushed to fit between the wavelength-converting tiles after the wavelength-converting tile platelets are attached. In some cases etching or wet bead blasting is then used to remove the TiO-silicone excess from the surface of the wavelength-converting tile platelet.

As previously indicated, the surfaces onto which the SGL is to be deposited must be free from debris and/or contaminants. Moreover, use of HRI adhesives often demand modified manufacturing processes and modified handling techniques so as to deposit and cure silicone adhesives between surfaces while an LED component is undergoing fabrication. Some such techniques are presented in FIG. 3A, FIG. 3B, FIG. 3C and FIG. 3D. The aforementioned series of figures present several process options that serve to overcome curing inhibition, specifically:

Make the surfaces less attractive to the catalyst through passivation and/or cleaning and/or removing and/or neutralizing contaminants (see FIG. 3B).

Make the surface participate or support the reaction by pre-adsorbing catalysts or by functionalization (see FIG. 3C).

Add more catalyst to the resin at some step during the manufacturing process where a shorter pot life does not have a severe impact on the manufacturing process involved in producing the LED components (see FIG. 3D).

FIG. 3A depicts a debris and contaminant field that inhibits adhesive curing when the adhesive is disposed between surfaces to be bonded together. As an option, one or more variations of adhesive curing when the adhesive is disposed between surfaces to be bonded together or any aspect thereof may be implemented in any environment and/or in any context of the embodiments described herein.

The two surfaces (e.g., the top surface of sapphire substrate $105_2$ and the bottom surface of the wavelength-converting tile $102_3$) must be rigorously cleaned before the SGL is dispensed inasmuch as some silicones are sensitive to many forms of residues and originations of contamination (for example, organic contamination, acrylic residue, acidic residue, soap residue, flux residue from soldering steps, etc.).

In particular, the water soluble solder flux that is used to attach the LED die to the wavelength-converting tile can create acidic residues that affect the curing of HRI SGLs. Rinsing in water at 60° C. has been shown to be sufficient to remove the acid residue such that the SGL curing is not inhibited. The surfaces can collect inorganic debris (e.g., from prior processing steps). Also, the surfaces might collect organic contaminations from the environment (e.g., airborne dust, dirt, etc.). Debris and contaminants must be removed such that the SGL curing is not inhibited.

Herein are disclosed techniques that can be used, singly or in combination, to clean the substrate and wavelength-converting tile surfaces such that the SGL curing is not inhibited and/or such that the dispensed SGL spreads uniformly across the entirety of both surfaces so as to form a bond of SGL that results in high RI media interfaces.

FIG. 3B depicts an assembly technique 3B00 as used in formation of uniform, high index of refraction media interfaces by using high-refractive-index adhesives. As an option, one or more variations of assembly technique 3B00 or any aspect thereof may be implemented in any environment and/or in any context of the embodiments described herein.

Components that are formed in accordance with the herein-disclosed techniques (e.g., with rigorous cleanliness at the surfaces where light moves through the materials forming the interfaces) result in components that have uniform performance characteristics.

As shown in FIG. 3B, the two surfaces (e.g., the top surface of sapphire substrate $105_2$ and the bottom surface of the wavelength-converting tile $102_3$) have been rigorously cleaned before the SGL is dispensed. When the SGL is dispensed over a surface and spread out over that surface (e.g., by pressing the wavelength-converting tile onto the SGL), since the two surfaces have been rigorously cleaned, the assembly formed will include a contaminant-free and debris-free wavelength-converting tile adhesion interface 107 as well as a contaminant-free and debris-free substrate adhesion interface 109. As such, the curing process of the cyclic ring-opening polymerization-cured SGL is not inhibited by contaminants or debris. Several cleaning and surface preparation techniques are presented infra.

FIG. 3C depicts an assembly technique 3C00 as used in formation of uniform, high index of refraction media interfaces by using pre-adsorbing catalysts or by functionalization. The shown technique serves to make the surface participate or support the reaction by pre-adsorbing catalysts or by functionalization. By operation of cleaning and pre-adsorption, the bottom surface of the wavelength-converting tile $102_3$ is treated so as to result in a contaminant-free and debris-free wavelength-converting tile adhesion interface 111. Similarly, the top surface of the sapphire substrate $105_2$ is treated so as to result in a contaminant-free and debris-free substrate adhesion interface 113.

FIG. 3D depicts an assembly technique 3D00 as used in formation of uniform, high index of refraction media interfaces by using gaseous catalyst introduction. As earlier discussed at pertaining to FIG. 1E, the ratio of resin to catalyst can be controlled so as to result in a relatively longer pot life or a relatively shorter pot life. In many cases, the deleterious effects of a relatively short pot life (e.g., unwanted curing in the dispensing apparatus) can be mitigated by dispensing an SGL mixture that is mixed in a midrange ratio of resin to catalyst (e.g., resulting in an acceptably long pot life) and then introducing catalyst on a gaseous or vaporous form to facilitate curing. In one specific case, the resin can be formulated as recommended by the manufacturer (e.g., in order to achieve a sufficiently long pot life), then dispense the formulated resin on the substrate to be bonded, and then introduce additional catalyst.

More specifically, after the resin has been dispensed on the substrate, it is brought into contact with vapors of a catalytic base such as DBU, DBN, or TMG. After this contact, the manufacturing process proceeds by applying the wavelength-converting tiles to the substrate and allowing the resin to cure. Following this technique, the dispensed formulation has a midrange pot life while the subsequent contact of the resin with vapors of a catalytic base serves to restore sufficient catalytic activity (e.g., by the vapor exposure) so as to achieve full cure. Variations of concentration of a catalyst through a progression of processes is shown and described as pertains to FIG. 3E.

Figure 3E:
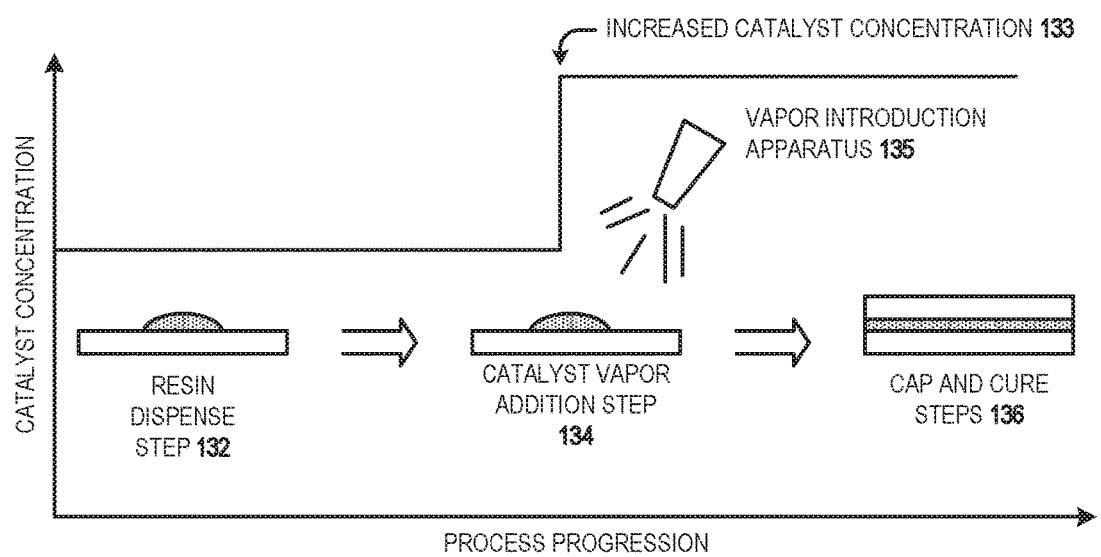
FIG. 3E depicts changes in concentration of a catalyst through a progression of processes to form uniform, high index of refraction media interfaces by using gaseous catalyst introduction, according to an embodiment.

FIG. 3E depicts changes in concentration of a catalyst through a progression of processes. The shown process progression begins with a resin dispense step 132 at which point in time the catalyst concentration is relatively lower as compared to the catalyst concentration at and after the catalyst vapor addition step 134. Any known technique and/or any known vapor introduction apparatus 135 can be used to expose the dispensed resin to additional catalyst. At the time that the resin is dispensed (e.g., at step 132), the pot life is relatively long, which is desired in many fabrication settings. However, the concentration at step 132 might not be high enough to cure the resin fully and/or within a relatively short time. As such, an increased catalyst concentration 133 can be achieved in the catalyst vapor addition step 134. At some moment after the increased catalyst concentration is deemed to be sufficient to cure the resin, the process can progress to cap and cure steps 136. A comparable result can be achieved by dipping or spraying the substrate (e.g., after siloxane dispense) in a siloxane nonsolvent media (e.g., water) containing a suitable catalyst. The catalyst dispensed by vapor phase or by liquid-liquid contact (e.g., at the liquid-liquid interface) exhibits a concentration gradient across the film thickness, with the highest concentration at the gas-liquid interface, and decreasing as it approaches the substrate-liquid interface.

Figure 3F:
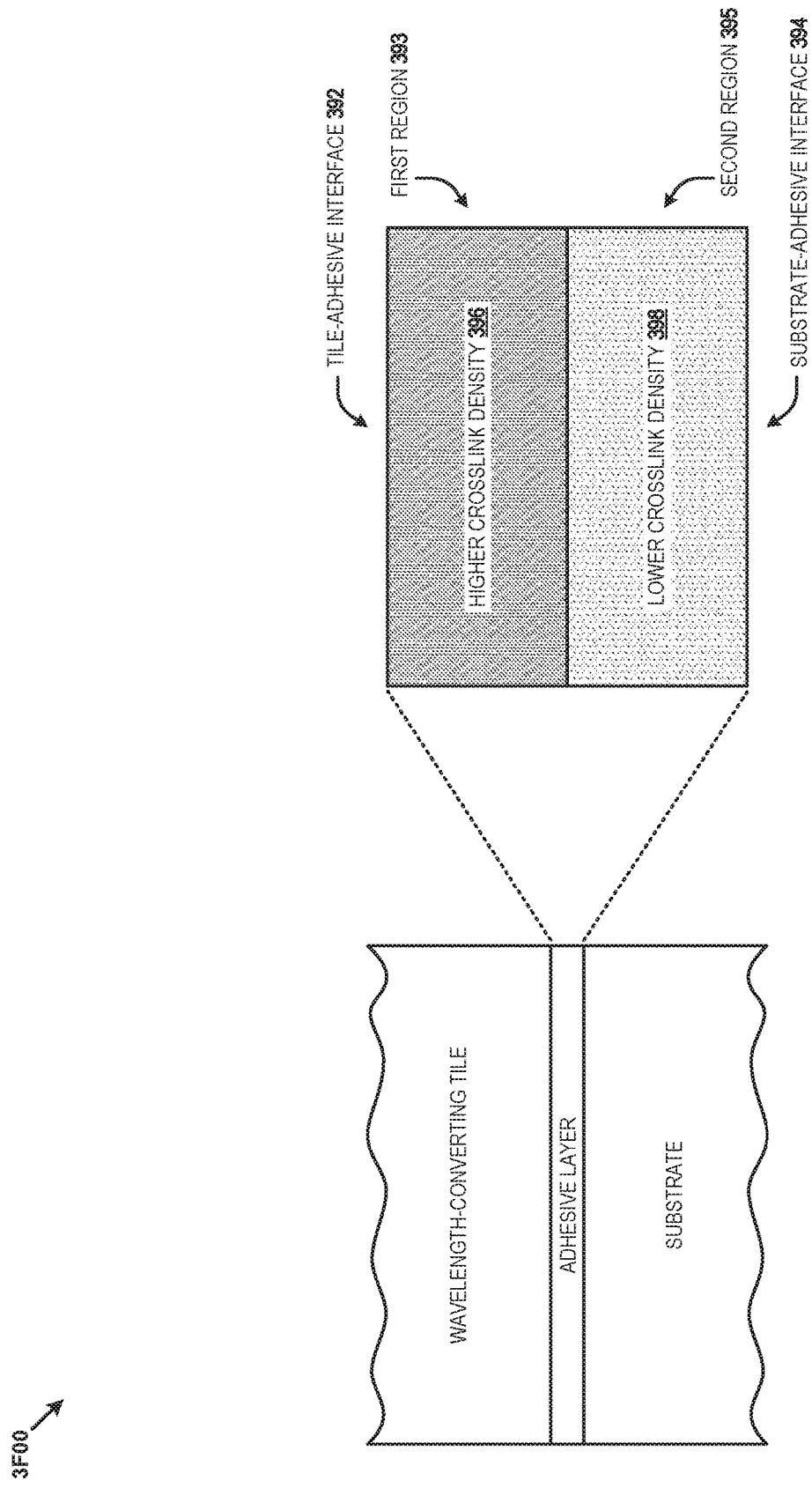
FIG. 3F depicts a concentration gradient across the thickness of the cured adhesive layer after applying the platelet and curing, according to an embodiment.

FIG. 3F depicts a concentration gradient 3F00 across the thickness of the cured adhesive layer after applying the platelet and curing. The adhesive layer exhibits a relatively higher crosslink density 396 at the tile-adhesive interface 392 as compared to the relatively lower crosslink density 398 at the substrate-adhesive interface 394. Such gradient is detectable using an atomic force microscope (AFM) or via nanoindentation.

The technique of FIG. 3F can be practiced in many variations. Strictly as examples, the silicone-containing adhesive layer might be disposed to form a layer thickness between a substrate formed of sapphire substrate and a wavelength-converting member formed by a tile or platelet. The silicone-containing adhesive layer exhibits a crosslink density gradient across the layer thickness. Depending on the orientation of the substrate and the wavelength-converting member (e.g., substrate on bottom or tile on bottom), the silicone-containing adhesive layer exhibits a relatively higher crosslink density gradient in a top region of the layer thickness and a relatively lower crosslink density gradient in a bottom region of the layer thickness. For example, depending on the choice of which surface the adhesive is dispensed or applied, the higher crosslink density might be near the tile-adhesive interface (as shown in FIG. 3F) or, depending on which surface the adhesive is dispensed or applied, the higher crosslink density might be near the substrate-adhesive interface 394. The variation of the crosslink density over the thickness of the adhesive results in relatively more intense properties on one side (e.g., in a first region 393) as compared to the other side (e.g., second region 395).

Cleaning and Adhesion Promotion Processes

As an option, one or more variations of the processing techniques discussed herein or any aspect thereof may be implemented in any environment and/or in any context of the embodiments described herein.

FIG. 4A depicts an oxygen plasma cleaning technique 4A00 as used in formation of uniform, high index of refraction media interfaces when using high-refractive-index adhesives. This oxygen plasma cleaning technique is used for removing the organic contaminations from the sapphire substrate surface. Oxygen plasma is known to deconstruct organic residues into CO and/or $CO_2$ type by-products.

The shown vacuum chamber oxygen plasma cleaning technique is merely an example. Different settings and/or different timings and or different orders are possible. The shown flow is initiated before the SGL is dispensed onto the sapphire substrate. The process proceeds as follows:
  Set power to 500 watts (see step 402).
  Set vacuum chamber pressure to 20 Pa or set chamber to atmospheric pressure (see step 404).
  Set $O_2$ gas flow to 50 ml/min (see step 406).
  Start, clean and stop with a 60-second cleaning time (see group 416 comprising step 408, step 410, and step 412).

After both the wavelength-converting tile and LED die have been cleaned, dispense the silicone. A one-hour maximum in-process queue time (see step 414) is allowed before dispensing the silicone onto the cleaned surfaces (see step 415).

In some cases, atmospheric pressure plasma cleaning or surface treatments are used rather than vacuum chamber treatments. Before the silicone is dispensed onto the sapphire, the LEDs are cleaned and/or treated using the plasma process. In one example treatment, the plasma process settings are: diameter=8 mm, flow speed=50 mm/sec, and nozzle angle=14 degrees. Using this atmospheric pressure plasma cleaning or surface treatment, there is a 2.5-hour maximum queue time allowed before dispensing the silicone after the surfaces have been cleaned.

Strictly as one possible alternative, the surfaces can be cleaned with tetramethylammonium hydroxide (NH4OH) in water prior to dispense and attach. One possible NH4OH cleaning process is shown and discussed as pertains to FIG. 4B. Other base solutions can be used instead of NH4OH, such as tetramethylammonium hydroxide (TMAOH) and tetrabutylphosphonium hydroxide (TBPOH).

Figure 4B:
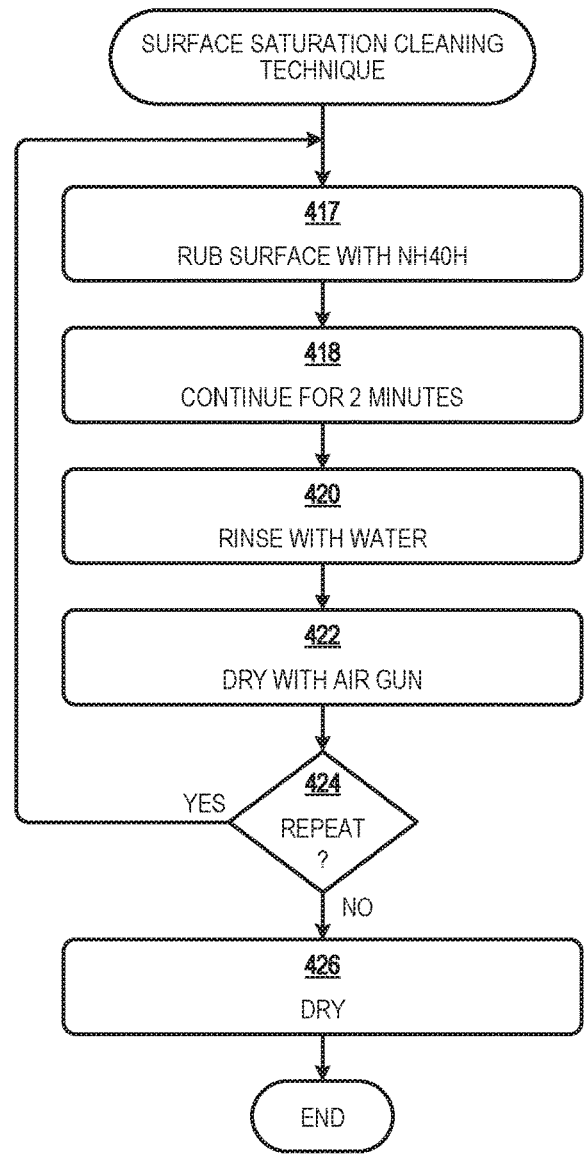
FIG. 4B depicts a surface saturation cleaning technique as used in formation of uniform, high index of refraction media interfaces when using high-refractive-index adhesives, according to some embodiments.

FIG. 4B depicts a surface saturation cleaning technique 4B00 as used in formation of uniform, high index of refraction media interfaces when using high-refractive-index adhesives. As an option, one or more variations of surface saturation cleaning technique 4B00 or any aspect thereof may be implemented in any environment and/or in any context of the embodiments described herein.

As shown, steps include:
  The surface is rubbed with a lint free swab loaded with 10% NH4OH liquid (see step 417).
  Continue for 2 minutes (see step 418). The wavelength-converting tile surface should be fully saturated.
  Rinse with water (see step 420).
  Dry with an air gun (see step 422).

Repeat the NH4OH rub/rinse/dry steps multiple times (e.g., four times) (see decision 424), then allow to thoroughly dry for eight hours (see step 426) before dispensing the SGL. All or portions of this process can be automated using a sonicator, a brush cleaning system, or the like.

Figure 5:
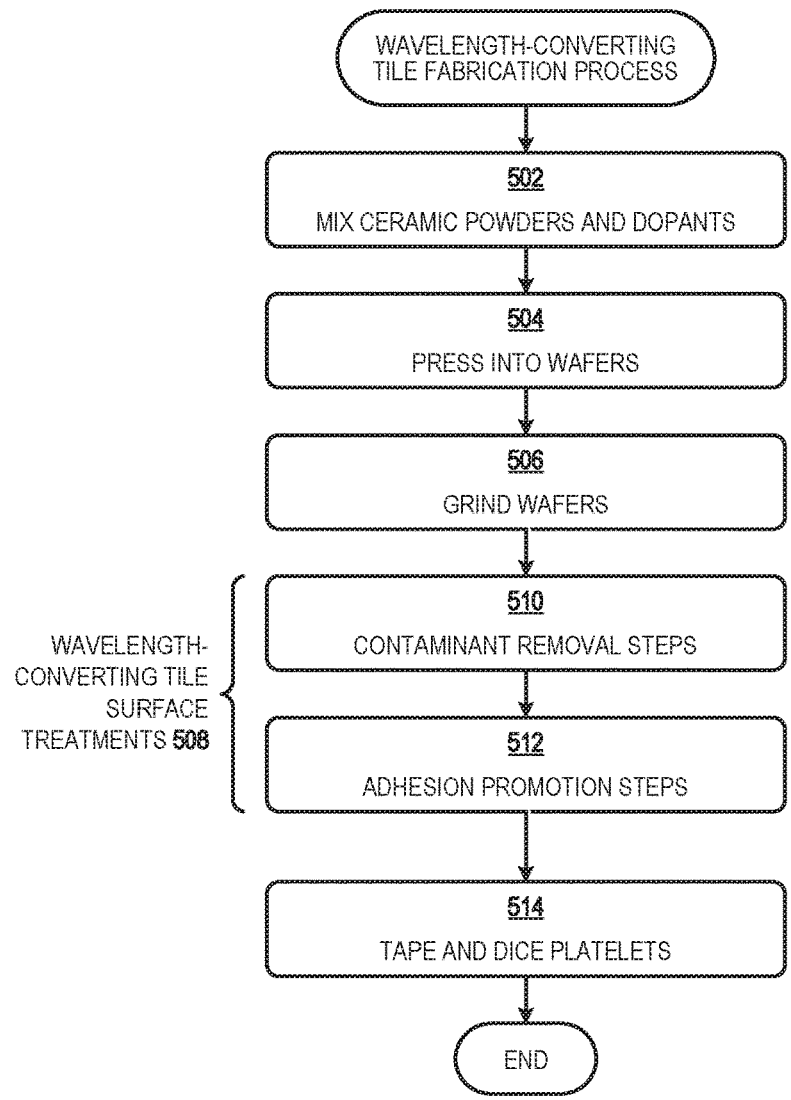
FIG. 5 depicts a wavelength-converting tile fabrication technique.

FIG. 5 depicts a wavelength-converting tile fabrication technique 500. As an option, one or more variations of wavelength-converting tile fabrication technique 500 or any aspect thereof may be implemented in any environment and/or in any context of the embodiments described herein. Specifically, although in some of the descriptions herein the wavelength-converting members (e.g., tiles) are ceramic, any suitable preformed wavelength-converting element may be used. Examples of suitable non-ceramic preformed wavelength-converting elements include powder phosphors that are disposed in transparent material such as silicone, or glass that is rolled, cast or otherwise formed into a sheet, then singulated into individual platelets.

The wavelength-converting members referred to herein are created by mixing ceramic powders with small quantities of dopants (see step 502), then pressing the powders into circular wafers (see step 504). The wafers are ground down from approximately 800 μm to approximately 300 μm in thickness, and then farther down from approximately 300 μm to approximately 110 μm in thickness (see step 506). After the approximately 110 μm thickness has been achieved, the wafers are taped and diced (see step 514) into, for example, die that are 1.06 mm×1.06 mm on edge.

The grinding steps involved to reduce the wavelength-converting tile thickness from approximately 800 μm down to approximately 110 μm uses chemicals, soaps, etc. that can cause a residue to remain on the wavelength-converting tile surface. Treating the wavelength-converting tile wafer with an aggressive base (e.g., NH4OH) after the grinding steps and before the dicing step (see group 508) is sufficient such that the selected adhesive cures correctly.

As shown, there are two steps involved in the wavelength-converting tile surface treatment before the platelets attached: (1) contaminant removal (see step 510), and (2) adhesion promotion steps (see step 512).

Figure 6A:
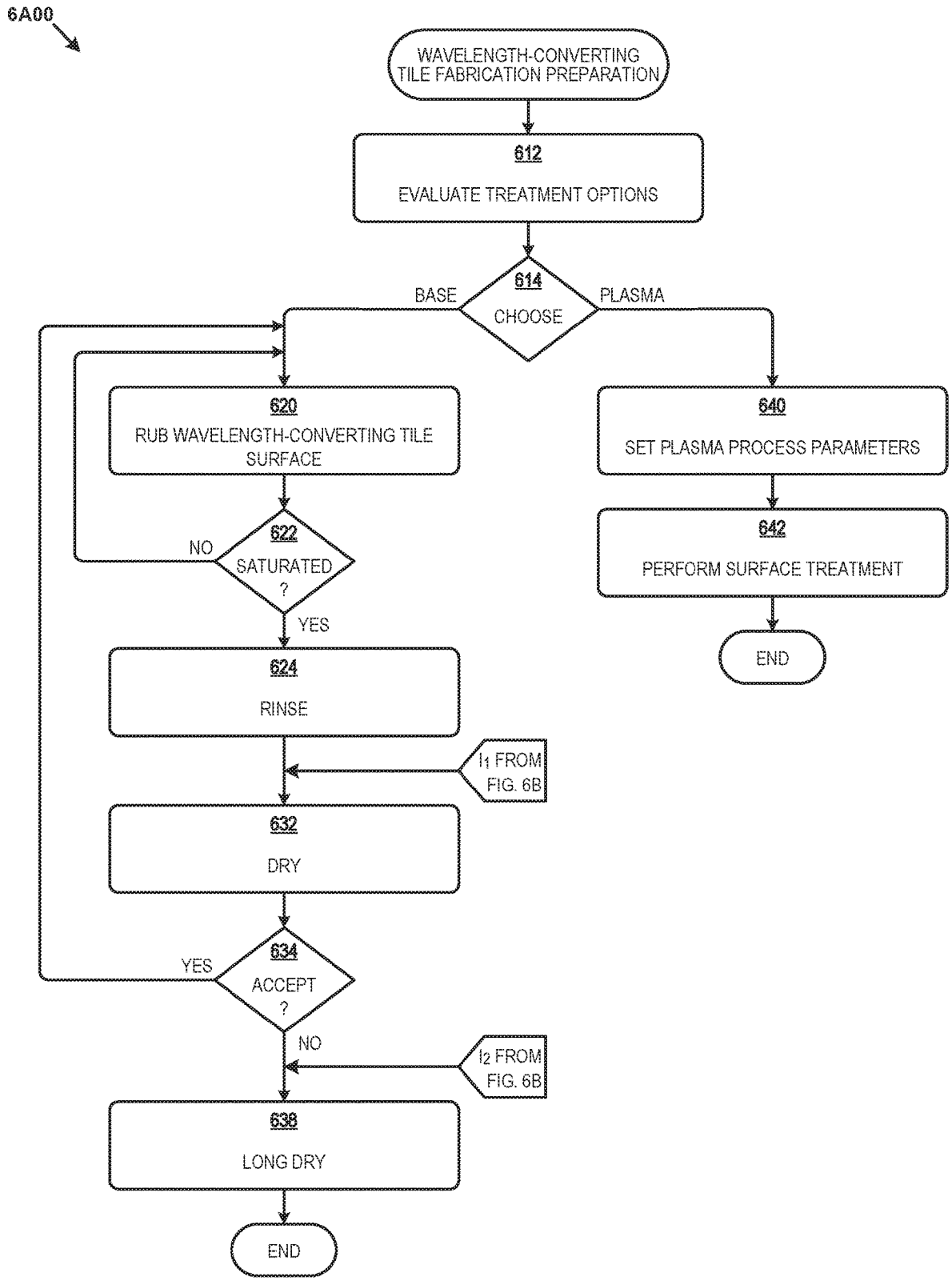
FIG. 6A depicts a wavelength-converting tile surface preparation technique used prior to formation of media interfaces when using high-refractive-index adhesives, according to some embodiments.

FIG. 6A depicts a wavelength-converting tile surface preparation technique 6A00 used prior to formation of media interfaces when using high-refractive-index adhesives. As an option, one or more variations of wavelength-converting tile surface preparation technique 6A00 or any aspect thereof may be implemented in any environment and/or in any context of the embodiments described herein.

The shown step 510 of FIG. 5 depicts a contaminant removal process. In some embodiments, the contaminant removal process begins with evaluation of treatment options (see step 612). Treatment options include (1) treating the wavelength-converting tile surfaces with a liquid base, or (2) cleaning the wavelength-converting tile surfaces with a plasma (see decision 614). Liquid bases include NH4OH, tetramethylammonium hydroxide (TMAOH), tetrabutyl phosphonium hydroxide (TBPOH), as well as other organic and inorganic bases such as KOH, LiOH, NaOH, TBD, DBU, DBN, and TMG. The base should be used in aggressive concentrations ranging from about 1% wt to about 35% wt depending on the base used. One example of treating wavelength-converting tile surfaces with a liquid base (e.g., NH4OH) is as follows:

Rub the surface of the wavelength-converting tile after dicing with a lint free Q-tip loaded with 10% NH4OH liquid for 2 minutes (see step 620).

Determine if the wavelength-converting tile surface is fully saturated (see decision 622).

Rinse with water (see step 624) then dry with an air gun (see step 632).

Determine if the rub/rinse/dry process is to be repeated (see decision 634). In some cases the cycle (e.g., see the "YES" branch of decision 634) is taken three or more times.

Allow to thoroughly dry for 8 hours before making attach (see step 638).

In some cases the evaluation of surface treatment options (see step 612) results in a choice to use a plasma treatment (see decision 614). In such cases, the plasma process settings can be set (see step 640). Strictly as one example, the plasma process settings can be set to diameter=4 to 10 mm, flow speed=10 to 50 mm/sec, nozzle angle=5 degrees to 15 degrees rotational, and track width=about 25 mm. When the plasma process parameters are set, the surface treatment can begin (see step 642).

Figure 6B:
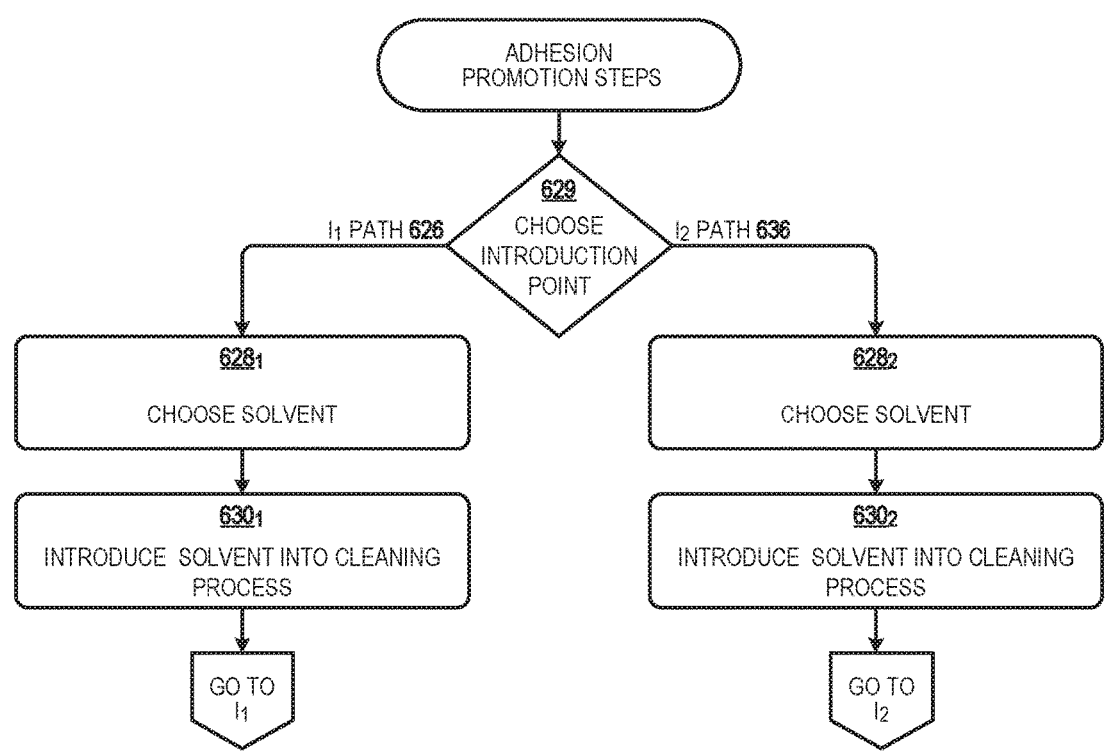
FIG. 6B depicts a series of adhesion promotion steps used prior to formation of media interfaces when using high-refractive-index adhesives, according to some embodiments.

FIG. 6B depicts a series of adhesion promotion steps 6B00 used prior to formation of media interfaces when using high-refractive-index adhesives. As an option, one or more variations of adhesion promotion steps 6B00 or any aspect thereof may be implemented in any environment and/or in any context of the embodiments described herein.

Additional chemical treatments can be used in conjunction with the cleaning techniques. Example chemicals include:

N-TRIMETHOXYSILYLPROPYL-N,N,N-TRIMETHYL-AMMONIUM CHLORIDE.

(3-TRIMETHOXYSILYLPROPYL)DIETHYLENETRI-AMINE.

N-(2-AMINOETHYL)-3-AMINOPROPYLSILANET-RIOL.

AMEO (3-Aminopropyltriethoxysilane).

(3-triethoxysilylpropyl)-TMG.

(3-triethoxysilylpropyl)-TBD.

(3-triethoxysilylpropyl) triphenylphosphonium hydroxide.

Polymeric (polycation) versions of the above-listed chemicals.

Strictly as one example, a procedure for chemical treatment of the wavelength-converting tile wafer using an adhesion promoter might commence at a decision to determine an insertion point for introducing the forgoing chemicals (see step 629). Depending on the choice, path 626 or path 636 is taken. In the former case, where insertion point $I_1$ is used to introduce the chemical, a solvent is selected (see step $628_1$) and the selected solvent is prepared for introduction into the cleaning process (see step $630_1$). In the latter case, where insertion point 12 is used to introduce the chemical, a solvent is selected (see step $628_2$) and the selected solvent is prepared for introduction into the cleaning process (see step $630_2$).

After the aforementioned wavelength-converting tile surface preparation technique has been completed, the SGL can be dispensed. Dispensing can be done using any known technique. Strictly as one example, dispensing can be done as follows:

Use a disposable pipet to place 3 to 4 drops of adhesion promoter onto the wavelength-converting tile surface such that a thin film fully covers the platelet. In some situations, effective concentrations of an adhesion promoter in water, methanol, ethanol etc. can be in the range of 0.1% wt to 50% wt.

Allow the film of the wet adhesion promoter to sit for 15 minutes.

Rinse with DI water.

Dry with air gun.

In some cases, other processes such as vapor phase adsorption and/or deposition of a monolayer of adhesion promoter can be used. Additionally, increasing the exposure time, concentrations of the adhesion promoter, and higher temperatures can be used to increase the effectiveness of the association of the adhesion promoter to the wavelength-converting tile surface.

When the wavelength-converting tile is attached to a sapphire substrate surface, a "flip" attach method is used. Such a flip attach method insures that the wavelength-converting tile surface that touches the tape surface does not touch the sapphire substrate surface. Instead, the wavelength-converting tile surface which has never touched the tape will be in contact with the SGL.

After the glue dispense and wavelength-converting tile platelet attach is complete, the wavelength-converting tile must be cured to fully crosslink the silicone. The cure recipe has two parts: the initial stage is to cure at a heat of 75° C. to 125° C. for 1 to 3 hours, and the final stage is to cure at a heat of 130° C. to 180° C. for 1 hour to 5 hours.

Figure 7:
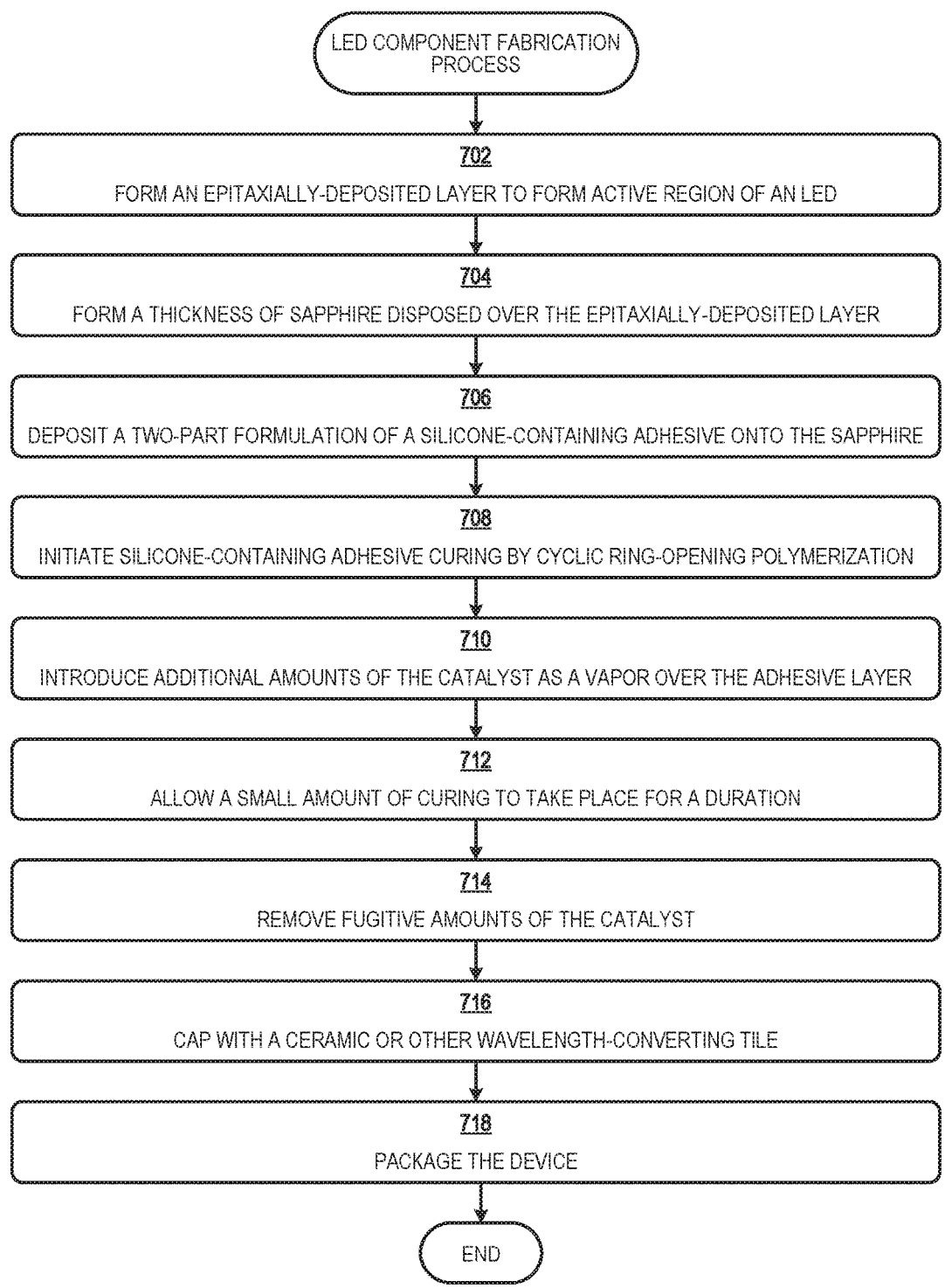
FIG. 7 depicts an LED component fabrication process, according to some embodiments.

FIG. 7 depicts an LED component fabrication process. Certain steps in the LED component fabrication process are shown in the flow 700. The portion of the component fabrication process depicted in flow 700 commences at a step to form a light-emitting diode having an epitaxially-deposited layer to form an active region that emits visible blue light in a wavelength range of about 450 nm to about 470 nm (at step 702). Next, form a thickness of sapphire disposed over the epitaxially-deposited layer (at step 704). Using a syringe or other apparatus, deposit a two-part formulation of a silicone-containing adhesive onto the sapphire (at step 706). The two-part formulation comprises a resin and a catalyst in a relatively lower concentration of catalyst. With such a relatively lower concentration of catalyst, the silicone-containing adhesive layer begins to cure slowly by forming by cyclic ring-opening polymerization of the silicone (at step 708). Introduce additional amounts of the catalyst as a vapor to increase the cure rate of the silicone-containing adhesive (at step 710). In the presence of additional amounts of the catalyst such as DBU-containing, or DBN-containing, or TMG-containing components, allow additional curing time for a duration (at step 712). Raising the ambient temperature around the device serves to remove at least some fugitive amounts of the catalyst (at step 714). Not all of the fugitive amount of the DBU-containing, or DBN-containing, or TMG-containing components are removed by the heating process, therefore the cured silicone-containing adhesive layer comprises residual organic base components (e.g., residual amounts of DBU, DBN, or TMG components) in a measurable concentration. Nevertheless, the ceramic or other wavelength-converting member is disposed in direct contact with the curing silicone-containing adhesive layer. Cap by applying pressure to the ceramic or other wavelength-converting tile (at step 716). Additional curing occurs after capping. The device is packaged (at step 718).

Figure 8:
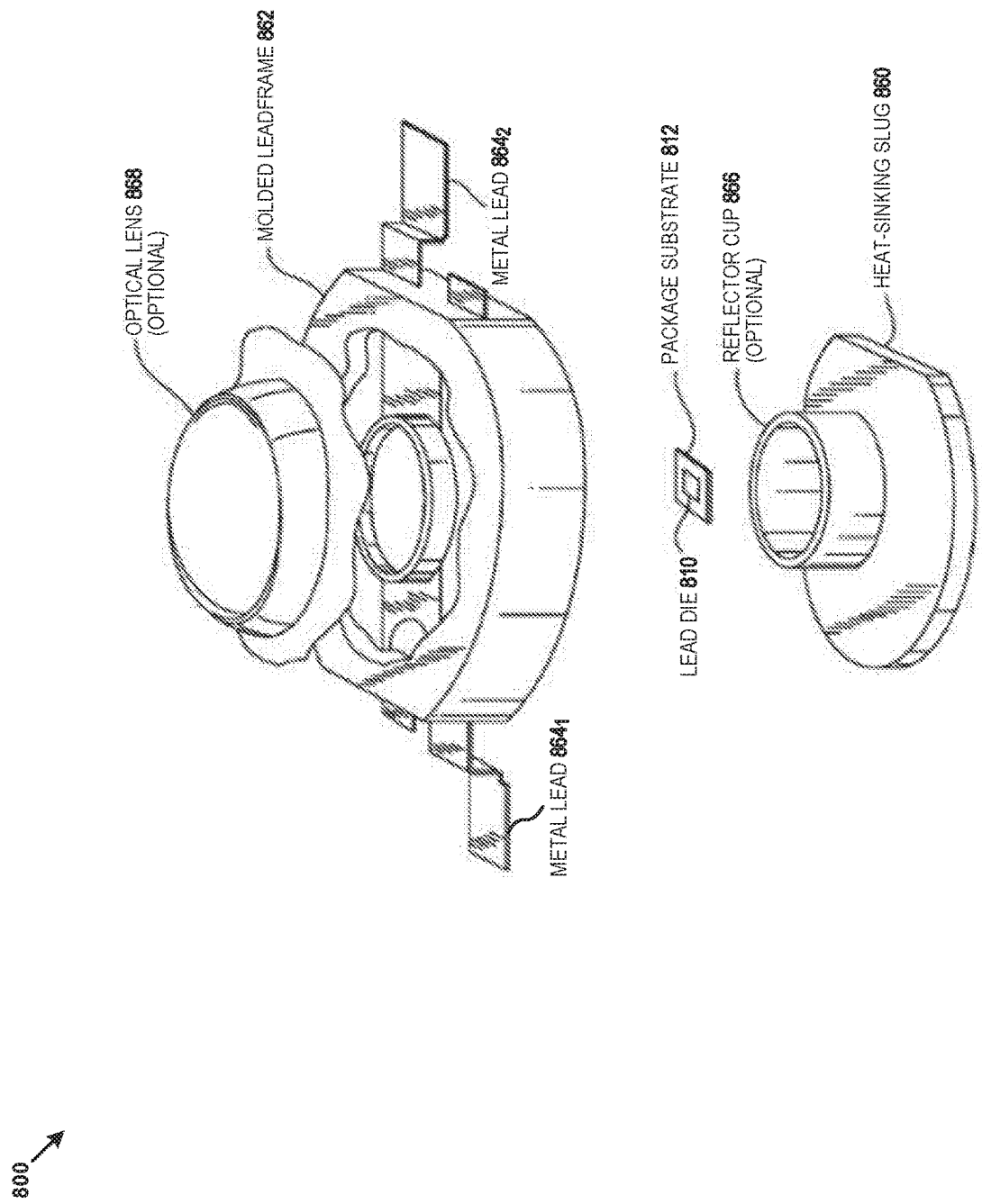
FIG. 8 depicts an LED assembly that comprises a light-emitting diode die that is formed using high-refractive-index adhesives, according to some embodiments.

FIG. 8 depicts an LED assembly 800 that comprises a light-emitting diode die that is formed using high-refractive-index adhesives. As an option, one or more variations of LED assembly 800 or any aspect thereof may be implemented in any environment and/or in any context of the embodiments described herein.

The embodiment shown in FIG. 8 is merely one example of an assembly formed using a packaged LED die that is in turn formed of any one or more variations of the foregoing fabrication techniques. As shown, the LED assembly 800 includes a package substrate 812 with an LED die 810 mounted in a package substrate 812. A heat-sinking slug 860 is placed into a molded leadframe 862. The molded leadframe 862 is, for example, a filled plastic material molded around metal leads (e.g., metal lead 8641 and metal lead 8642) that provide an electrical path. The heat-sinking slug 860 may include an optional reflector cup 866. The LED die 810 attached to the package substrate 812 is mounted directly or indirectly to heat-sinking slug 860. The metal leads are bonded to the electrodes on the package substrate 812. An optional optical lens 868 may be added.

Additional Embodiments of the Disclosure

Additional Practical Application Examples

Automotive LED parts can be made using variations of the herein-disclosed techniques. More specifically, a high-refractive-index (greater than 1.5) silicone is dispensed onto the sapphire before a wavelength-converting tile platelet is placed. In some cases the silicone can be stored as a single component silicone or can be stored as a multi-part mixture that is mixed before dispensing. Standard dispense techniques can be used to apply a control quantity of the silicone to the sapphire surface. After the wavelength-converting tile is attached, the glue is thermally cured to a firm solid consistency (e.g., hardness A 48-50). The foregoing processes may require from 1 hour to 8 hours at temperatures between 70° C. to 150° C. After the glue is cured, a reflective silicone-containing material can fill over the remaining sections of the substrate including the sidewall of the outer edges of the LED. After the silicone-containing filler has hardened, an etch back process can be used to remove the filler on top of the LED as well as to remove it from the bond pad surface, thus exposing metal for electrical connections.

Various etch back techniques can be used in this integration scheme. Strictly as examples are a wet bead blast and a dry bead blast. When using a dry bead blast technique, 80 μm baking soda particles impinge the surface to be blasted. In a wet bead blast technique, 180 μm plastic particles in a water slurry are directed to the surfaces to be blasted.

The resulting assembly exhibits a very high shear strength. The shear test data below corresponds to an example of a wavelength-converting tile lap shearing from the sapphire surface when an appropriate cleaning method, adhesion promoter and a high-refractive-index adhesive was used for attach.

TABLE 1

| | | | | Shear test data | | | | | |
|---|---|---|---|---|---|---|---|---|---|
| Tile Type | Silicone Type | O2 Plasma on Tile | O2 Plasma on Platelet | Pretreats on Platelet | Platelet Type | Mean Shear | STDEV Shear | Poke Test | Survived OSC/MBB |
| Rubix | 4960 | 60 sec/ 500 W | 60 sec/ 500 W | NH4OH 10% scrub post dice +8514 | LR | 996.7 | 178.37 | Cured | 5/5 |

Note:
8514 is N-TRIMETHOXYSILYLPROPYL-N,N,N-TRIMETHYLAMMONIUM CHLORIDE: 50% in methanol.

Additional Systems Employing Embodiments of the Disclosure

Additional Examples

Figure 9A:
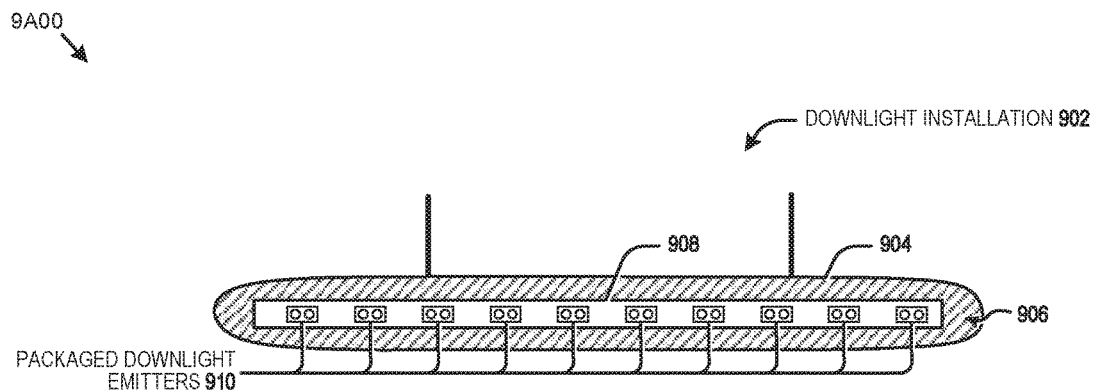
FIG. 9A, FIG. 9B and FIG. 9C depict luminaires suitable for use in various configurations of the embodiments of the present disclosure, and/or for use in the herein-described environments.

FIG. 9A presents a side view 9A00 of a downlight installation. As shown, the downlight installation 902 includes a rigid or semi-rigid housing 904 that supports a light emitting device array 906. The array of light emitting devices can be organized into any arrangement, for example and as shown, into a linear array that is disposed in within the boundary of a printed wiring board module 908. Some downlights might be composed of more (or fewer) instances of packaged downlight emitters 910 in the light emitting device array.

Figure 9B:
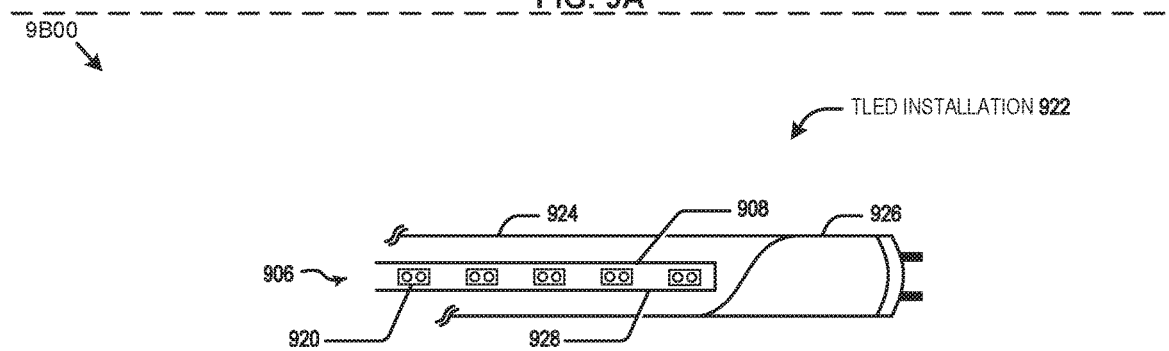

FIG. 9B presents a side view 9B00 of a tube light-emitting diode (TLED) installation. As shown, a TLED installation 922 includes a linear array of instances of TLED emitters 920 that are organized so as to fit within the TLED cavity formed by the TLED tube boundary 924. The array of light emitting devices can be organized into any arrangement, for example and as shown, into a linear array that is disposed in within the boundary of a printed wiring board module 908. A tubular rigid or semi-rigid housing 926 supports a rigid or flexible substrate 928 that supports a light emitting device array 906. The rigid or flexible substrate 928 can include printed wiring structures (e.g., traces, thru-holes, connectors, etc.) or other electrically conductive structures disposed on one or both sides of the rigid or flexible substrate.

Figure 9C:
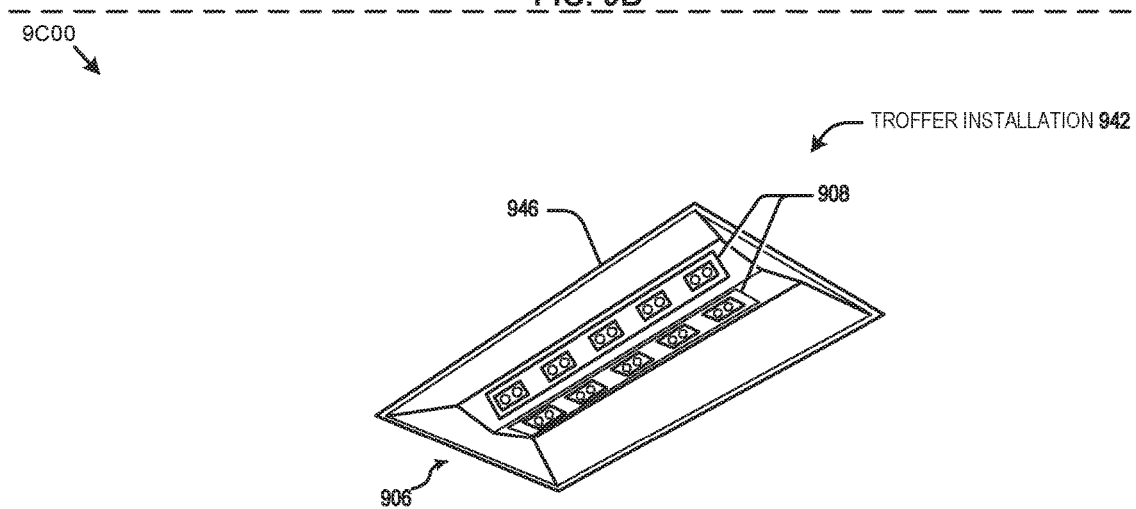

FIG. 9C presents a view 9C00 of a troffer installation. As shown, the troffer installation 942 includes a rigid or semi-rigid shaped housing 946 that supports an array of light emitting devices. The array of light emitting devices can be organized into any arrangement, for example and as shown, into an arrangement onto a printed wiring board module 908 that is disposed within the boundary of the shaped housing. Some troffers might be composed of more (or fewer) instances of light emitting devices being populated onto the printed wiring board module.

Having described the invention in detail, those skilled in the art will appreciate that given the present disclosure, modifications may be made to the invention without departing from the spirit of the inventive concepts described herein. Therefore, it is not intended that the scope of the invention be limited to the specific embodiments illustrated and described.

What is being claimed is:

1. An apparatus comprising:
   a sapphire substrate having a first surface and an oppositely positioned second surface;
   an epitaxial layer disposed on the first surface of the sapphire substrate, the epitaxial layer
   forming an active region of a light-emitting diode that emits visible blue light in a wavelength range of about 450 to about 470 nm;
   a wavelength converting member disposed adjacent the second surface of the sapphire substrate; and
   a silicone-containing adhesive layer disposed between the second surface of the sapphire substrate and the wavelength-converting member, in direct contact with the second surface of the sapphire substrate, in direct contact with the wavelength converting member, formed by a cyclic ring-opening polymerization of the silicone, comprising amounts of at least one organic base, and exhibiting a crosslink density gradient between the second surface of the sapphire substrate and the wavelength converting member.

2. The apparatus of claim 1, wherein the crosslink density gradient exhibits a relatively higher crosslink concentration in a first region of the silicone-containing adhesive layer near the wavelength-converting member and a relatively lower crosslink concentration in a second region of the silicone-containing adhesive layer near the second surface of the sapphire substrate.

3. The apparatus of claim 1, wherein the wavelength-converting member comprises a ceramic.

4. The apparatus of claim 1, wherein the sapphire substrate has an index of refraction of about 1.75 to about 1.8.

5. The apparatus of claim 1, wherein the silicone-containing adhesive layer has an index of refraction of about 1.5 to about 1.7.

6. The apparatus of claim 1, wherein the wavelength-converting member has an index of refraction of about 1.7 to about 2.0.

7. The apparatus of claim 1, wherein the organic base comprises at least one of, guanidines, amidines, phophazenes, quaternary phosphonium or ammonium hydroxides, or combinations thereof.

8. The apparatus of claim 7, wherein the organic base comprises at least one of tetramethylguanidine, 1,5-Diazabicyclo[4.3.0]non-5-ene, or 1,8-diazabicyclo[5.4.0]undec-7-ene, or 1,5,7-triazabicyclo[4.4.0]dec-5-ene, or combinations thereof.

9. The apparatus of claim 1, wherein the crosslink density gradient exhibits a relatively higher crosslink concentration in a first region of the silicon-containing adhesive layer near the second surface of the sapphire substrate and a relatively lower crosslink concentration in a second region of the silicon-containing adhesive layer near the wavelength converter.

10. The apparatus of claim 1, wherein:
    the sapphire substrate has an index of refraction of about 1.75 to about 1.8;
    the silicone-containing adhesive layer has an index of refraction of about 1.5 to about 1.7; and
    the wavelength-converting member has an index of refraction of about 1.7 to about 2.0.

11. The apparatus of claim 10, wherein the wavelength-converting member comprises a ceramic.

12. The apparatus of claim 11, wherein the crosslink density gradient exhibits a relatively higher crosslink concentration in a first region of the silicon-containing adhesive layer near the wavelength-converting member and a relatively lower crosslink concentration in a second region of the silicone-containing adhesive layer near the second surface of the sapphire substrate.

13. The apparatus of claim 11, wherein the crosslink density gradient exhibits a relatively higher crosslink concentration in a first region of the silicone-containing adhesive layer near the second surface of the sapphire substrate and a relatively lower crosslink concentration in a second region of the silicon-containing adhesive layer near the wavelength converter.

14. A method comprising:
    providing an epitaxial layer on a first surface of a sapphire substrate to form an active region of a light-emitting diode that emits visible blue light in a wavelength range of about 450 to about 470 nm; and
    attaching a wavelength converting member to a second surface of the sapphire substrate, opposite from the first surface, with a silicon-containing adhesive layer disposed in direct contact with the second surface of the sapphire substrate and in direct contact with the wavelength-converting member, formed by a cyclic ring-opening polymerization of the silicone, comprising amounts of at lest one organic base, and exhibiting a crosslink density gradient between the second surface of the sapphire substrate and the wavelength converting member.

15. The method of claim 14, wherein the crosslink density gradient exhibits a relatively higher crosslink concentration in a first region of the silicone-containing adhesive layer near the wavelength converting member and a relatively lower crosslink concentration in a second region of the silicone-containing adhesive layer near the second surface of the sapphire substrate.

16. The method of claim 14, wherein the wavelength-converting member comprises a ceramic.

17. The method of claim 14, wherein attaching the wavelength converter to the sapphire substrate comprises applying pressure to the wavelength-converting member to press into the silicon-containing adhesive layer.

18. The method of claim 14, wherein the crosslink density gradient exhibits a relatively higher crosslink concentration in a first region of the silicone-containing adhesive layer near the second surface of the sapphire substrate and a relatively lower crosslink concentration in a second region of the silicone-containing adhesive layer near the wavelength converter.

* * * * *